(12) United States Patent
Jiang et al.

(10) Patent No.: US 10,627,095 B2
(45) Date of Patent: Apr. 21, 2020

(54) LED LAMP WITH A SLEEVE

(71) Applicant: JIAXING SUPER LIGHTING ELECTRIC APPLIANCE CO., LTD, Jiaxing (CN)

(72) Inventors: Tao Jiang, Jiaxing (CN); Mingbin Wang, Jiaxing (CN); Aiming Xiong, Jiaxing (CN); Lin Zhou, Jiaxing (CN)

( * ) Notice: Subject to any disclaimer, the term of this patent is extended or adjusted under 35 U.S.C. 154(b) by 0 days.

(21) Appl. No.: 16/432,926

(22) Filed: Jun. 6, 2019

(65) Prior Publication Data

US 2019/0285264 A1     Sep. 19, 2019

Related U.S. Application Data

(63) Continuation of application No. 16/267,747, filed on Feb. 5, 2019.

(30) Foreign Application Priority Data

Feb. 8, 2018  (CN) .......................... 2018 1 0130085
May 18, 2018  (CN) .......................... 2018 1 0479044
(Continued)

(51) Int. Cl.
*F21V 29/00*     (2015.01)
*F21V 29/503*   (2015.01)
(Continued)

(52) U.S. Cl.
CPC ............ *F21V 29/503* (2015.01); *F21K 9/235* (2016.08); *F21K 9/237* (2016.08); *F21K 9/238* (2016.08);
(Continued)

(58) Field of Classification Search
CPC ...... F21V 29/503; F21V 29/83; F21V 29/773; H05B 45/395; H05B 45/50; H05B 45/37;
(Continued)

(56) References Cited

U.S. PATENT DOCUMENTS 7,748,870 B2 *   7/2010   Chang ................... F21V 29/004
                                                        362/294
9,897,304 B2 *   2/2018   Shum .................... F21V 23/006
(Continued)

FOREIGN PATENT DOCUMENTS

CN     201606689 U     10/2010
CN     201651880 U     11/2010
(Continued)

*Primary Examiner* — Ali Alavi
(74) *Attorney, Agent, or Firm* — Simon Kuang Lu

(57) ABSTRACT

An LED lamp includes: a lamp shell including a lamp head, a lamp neck and a sleeve; a passive heat dissipating element having a heat sink; a power source having a first portion and a second portion; and a light emitting surface comprising LED chips; wherein the sleeve of the lamp shell is made of a material having lower thermal conductivity than that of material of the heat sink; wherein the sleeve of the lamp shell is encircle covered by the heat sink, such that the second portion of the power source and the heat sink of the passive heat dissipating element are thermally insulated by the sleeve to prevent thermal effecting from the heat sink to the power source in the sleeve.

20 Claims, 22 Drawing Sheets

(30) Foreign Application Priority Data

| Date | | |
|---|---|---|
| May 28, 2018 | (CN) | 2018 1 0523952 |
| Jun. 6, 2018 | (CN) | 2018 1 0573322 |
| Jun. 20, 2018 | (CN) | 2018 1 0634571 |
| Jul. 12, 2018 | (CN) | 2018 1 0763089 |
| Jul. 12, 2018 | (CN) | 2018 1 0763800 |
| Aug. 24, 2018 | (CN) | 2018 1 0972904 |
| Oct. 9, 2018 | (CN) | 2018 1 1172470 |
| Nov. 1, 2018 | (CN) | 2018 1 1295618 |
| Nov. 2, 2018 | (CN) | 2018 1 1299410 |
| Nov. 13, 2018 | (CN) | 2018 1 1347198 |
| Nov. 19, 2018 | (CN) | 2018 1 1378174 |
| Dec. 3, 2018 | (CN) | 2018 1 1466198 |

(51) Int. Cl.

| | | |
|---|---|---|
| *F21K 9/235* | (2016.01) | |
| *F21V 29/77* | (2015.01) | |
| *F21K 9/238* | (2016.01) | |
| *F21K 9/237* | (2016.01) | |
| *F21V 29/83* | (2015.01) | |
| *F21K 9/66* | (2016.01) | |
| *F21K 9/68* | (2016.01) | |
| *H05B 45/50* | (2020.01) | |
| *H05B 45/395* | (2020.01) | |
| *F21V 7/00* | (2006.01) | |
| *H03H 11/04* | (2006.01) | |
| *F21Y 115/10* | (2016.01) | |
| *F21Y 105/18* | (2016.01) | |
| *H03H 7/01* | (2006.01) | |

(52) U.S. Cl.
CPC ............ *F21K 9/66* (2016.08); *F21K 9/68* (2016.08); *F21V 7/0025* (2013.01); *F21V 29/773* (2015.01); *F21V 29/83* (2015.01); *H05B 45/395* (2020.01); *H05B 45/50* (2020.01); *F21Y 2105/18* (2016.08); *F21Y 2115/10* (2016.08); *H03H 7/0115* (2013.01); *H03H 11/04* (2013.01)

(58) Field of Classification Search
CPC ..... F21K 9/88; F21K 9/66; F21K 9/83; F21K 9/237; F21K 9/238; F21K 9/235; F21K 9/233; H03H 7/0115; F21Y 2105/18; F21Y 2116/10
USPC ............................................. 362/294
See application file for complete search history.

(56) References Cited

U.S. PATENT DOCUMENTS

| | | | |
|---|---|---|---|
| 2007/0230188 A1 | 10/2007 | Lin | |
| 2012/0085516 A1* | 4/2012 | McClellan | F21V 15/013 165/80.3 |
| 2016/0025322 A1* | 1/2016 | Chen | F21K 9/232 362/373 |

FOREIGN PATENT DOCUMENTS

| | | |
|---|---|---|
| CN | 102032491 A | 4/2011 |
| CN | 102374427 A | 3/2012 |
| CN | 102859256 A | 1/2013 |
| CN | 203190364 U | 9/2013 |
| CN | 203442750 U | 2/2014 |
| CN | 203656721 U | 6/2014 |
| CN | 204114712 U | 1/2015 |
| CN | 104728631 A | 6/2015 |
| CN | 204717489 U | 10/2015 |
| CN | 204785745 U | 11/2015 |
| CN | 107345628 A | 11/2017 |
| CN | 108368977 A | 8/2018 |
| KR | 100932192 B1 | 12/2009 |

* cited by examiner

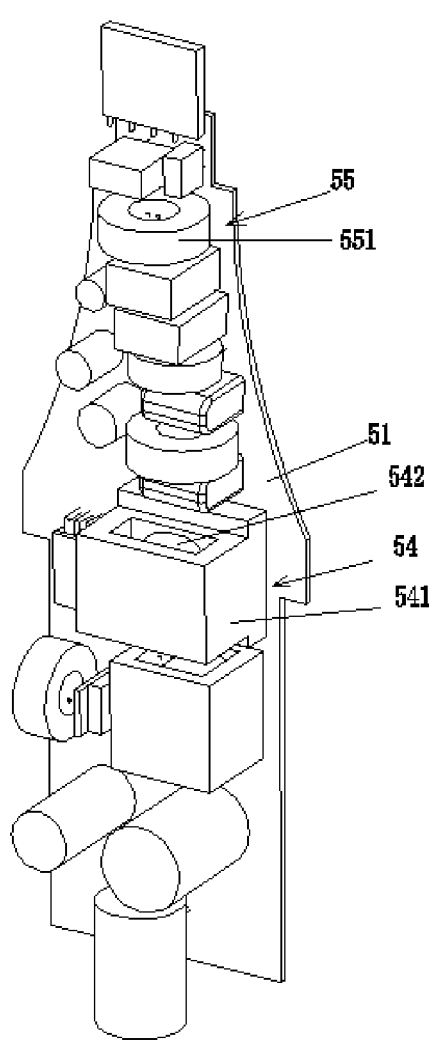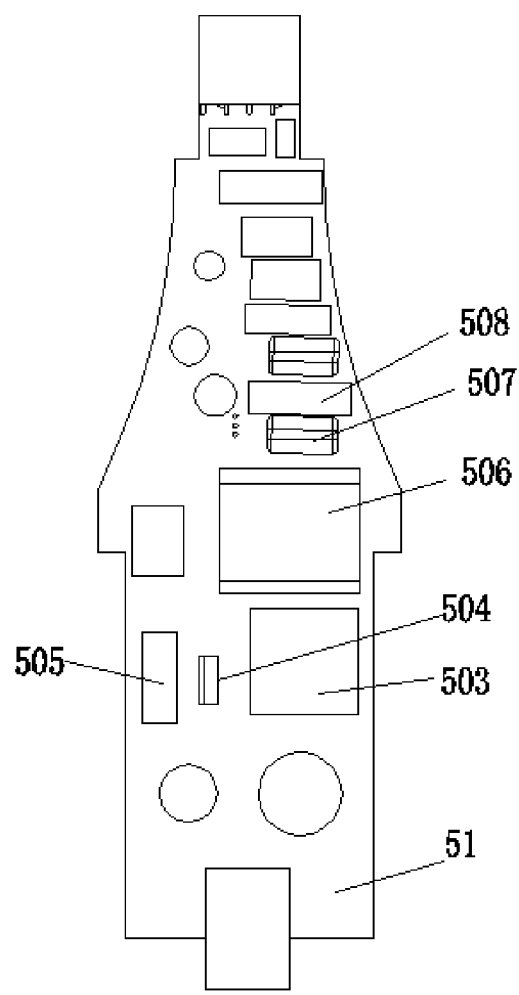
FIG. 19C    FIG. 19D
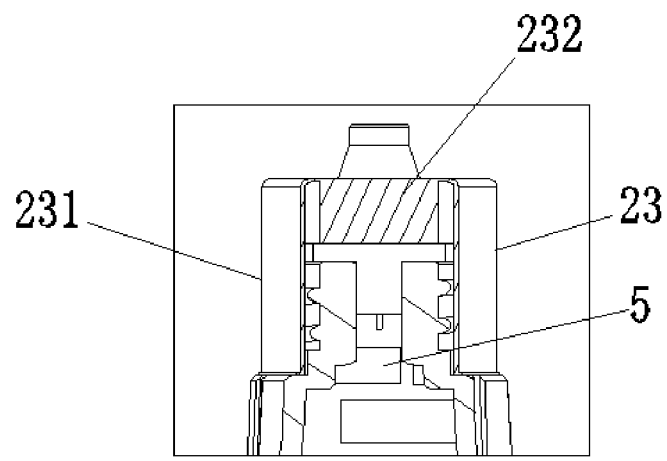
FIG. 20

LED LAMP WITH A SLEEVE

CROSS-REFERENCE TO RELATED APPLICATIONS

This application is a continuation application of U.S. application Ser. No. 16/267,747 filed on 2019 Feb. 5, which claims priority to the following Chinese Patent Applications No. CN 201810130085.3 filed on 2018 Feb. 8, CN 201810479044.5 filed on 2018 May 18, CN 201810523952.X filed on 2018 May 28, CN 201810573322.3 filed on 2018 Jun. 6, CN 201810634571.9 filed on 2018 Jun. 20, CN 201810763800.7 field on 2018 Jul. 12, CN 201810763089.5 filed on 2018 Jul. 12, CN 201810972904.9 filed on 2018 Aug. 24, CN 201811172470.0 filed on 2018 Oct. 9, CN 201811295618.X filed on 2018 Nov. 1, CN 201811299410.5 filed on 2018 Nov. 2, CN 201811347198.5 filed on 2018 Nov. 13, CN 201811378174.6 filed on 2018 Nov. 19, and CN 201811466198.7 filed on 2018 Dec. 3, the disclosures of which are incorporated herein in their entirety by reference.

FIELD OF THE INVENTION

The invention relates to lighting, particularly to LED lamps with a sleeve.

BACKGROUND OF THE INVENTION

A currently available LED lamp generally includes a light source, a heat sink, a power source, a lamp shell and a lamp cover. The light source is fastened onto the heat sink. The power source is disposed in the lamp shell. The lamp shell connects to the heat sink. The lamp shell includes a head for connecting a lamp socket. Currently available LED lamps have the following drawbacks:

Concerns with arrangement of power sources: for some high-power LED lamps, such as power of up to 150 W~300 W, heat dissipation of their power sources is also important. If heat from a power source of a working LED lamp cannot be dissipated timely, then life of some electronic components will be affected and finally life of a whole lamp will be affected. Usually, there is no effective heat management between a heat sink and a power source in a currently existing LED lamp. This will result in mutual influence between heat of a heat sink and a power source.

OBJECT AND SUMMARY OF THE INVENTION

The LED lamp described in the present disclosure includes an LED (light emitting diode) lamp comprising: a lamp shell including a lamp head, a lamp neck and a sleeve, the lamp head connects to the lamp neck which connects to the sleeve; a passive heat dissipating element having a heat sink connected to the lamp shell; a power source having a first portion and a second portion, wherein the first portion of the power source is disposed in the lamp neck, and the second portion of the power source is disposed in inner space of the sleeve; and a light emitting surface connected to the heat sink of the passive heat dissipating element and comprising LED chips electrically connected to the power source; wherein the sleeve of the lamp shell is made of a material having lower thermal conductivity than that of material of the heat sink; wherein the sleeve of the lamp shell is encircle covered by the heat sink, such that the second portion of the power source and the heat sink of the passive heat dissipating element are thermally insulated by the sleeve to prevent thermal effecting from the heat sink to the power source in the sleeve.

Preferably, height of the lamp neck is at least 80% of height of the heat sink.

Preferably, the heat sink comprises fins and a base, the light emitting surface is formed with an air inlet, the air inlet is located in a lower portion of the heat sink and radially corresponds to an inner side or the inside of the heat sink, the inner side or the inside of the fins corresponds to an outer wall of the sleeve of the lamp shell.

Preferably, the sleeve and the lamp neck are made of plastic.

Preferably, a distance is kept between distal ends of the fins and the sleeve, and air exists in the distance between the fins and the sleeve of the lamp shell.

Preferably, part of the fins are in contact with an outer surface of the sleeve.

Preferably, a first heat dissipating channel formed in a chamber of the lamp shell for dissipating heat generated from the power source while the LED lamp is working, and the chamber is located between bottom of the LED lamp and an upper portion of the lamp neck, the first heat dissipating channel comprises a first end on the light emitting surface to allow air flowing from outside of the LED lamp into the chamber, and a second end on the upper portion of the lamp neck of the lamp shell to allow air flowing from inside of the chamber out to the LED lamp.

Preferably, a second heat dissipating channel formed in the heat sink and between the fins and the base for dissipating the heat generated from the LED chips and transferred to the heat sink, the second heat dissipating channel comprises a third end on the light emitting surface to allow air flowing from outside of the LED lamp into the second heat dissipating channel, and flowing out from spaces between every adjacent two of the fins.

Preferably, the light emitting surface further comprises an aperture configured to simultaneously communicate with both the first end of the first heat dissipating channel and the third end of the second heat dissipating channel.

Preferably, the aperture is located in a central region of the light emitting, and the aperture forms an air intake of both the first heat dissipating channel and the second heat dissipating channel.

Preferably, the second end on the lamp shell is formed with a venting hole, the lamp shell has an airflow limiting surface which extends radially outwardly and is located away from the venting hole, the airflow limiting surface cloaks at least part of the fins.

Preferably, upper portions of at least part of the fins in the axial direction of the LED lamp correspond to the airflow limiting surface.

Preferably, further comprising a lamp cover, the lamp cover connected with the heat sink and having a light output surface and an end surface, wherein the end surface is formed with a vent to let air flowing from outside of the LED lamp into both the first heat dissipating channel and the second heat dissipating channel through the vent.

Preferably, the first end is projected onto the end surface in an axis of the LED lamp to occupy an area on the end surface, which is defined as a first portion, another area on the end surface is defined as a second portion, and the vent in the first portion is greater than the vent in the second portion in area.

Preferably, all the electrolytic capacitors are disposed in the sleeve.

Preferably, at least one of the electronic components of the power source, which is the most adjacent to the first end of the first heat dissipating channel is one of the electrolytic capacitor.

Preferably, at least part of the electrolytic capacitor which is the most adjacent to the first end of the first heat dissipating channel exceeds the power board in the axial direction of the LED lamp.

Preferably, total height of the lamp neck and the lamp head is greater than height of the heat sink.

Preferably, further comprising an inner reflecting surface disposed inside the light output surface of the lamp cover and an outer reflecting surface disposed in the outer circle of the array of the LED chips, wherein the inner reflecting surface is configured to reflect part of light emitted from the inmost of the array of LED chips, the outer reflecting surface is configured to reflect part of light emitted from the outermost of the array of LED chips.

Preferably, the heat sink comprises first fins and second fins, bottoms of both the first fins and the second fins in an axis of the LED lamp connect to the base, the first fins interlace with the second fins at regular intervals, and one of the second fins includes a third portion and two fourth portions, the two fourth portions are symmetrical about the third portion.

BRIEF DESCRIPTION OF THE DRAWINGS

The following detailed descriptions, given by way of example, and not intended to limit the present invention solely thereto, will be best be understood in conjunction with the accompanying figures:

FIGS. 19A~19C are perspective views of the power source, according to some embodiments of the present invention;

FIG. 19D is a main view of the power source of the embodiment of FIGS. 19A-19C;

FIG. 20 is an enlarged view of portion B in FIG. 2;

DETAILED DESCRIPTION OF THE EMBODIMENTS

To make the present invention understandable and readable, the following disclosure will now be described in the following embodiments with reference to the drawings. The following descriptions of various embodiments of this invention are presented herein for purpose of illustration and giving examples only. It is not intended to be exhaustive or to be limited to the precise form disclosed.

Figure 1:
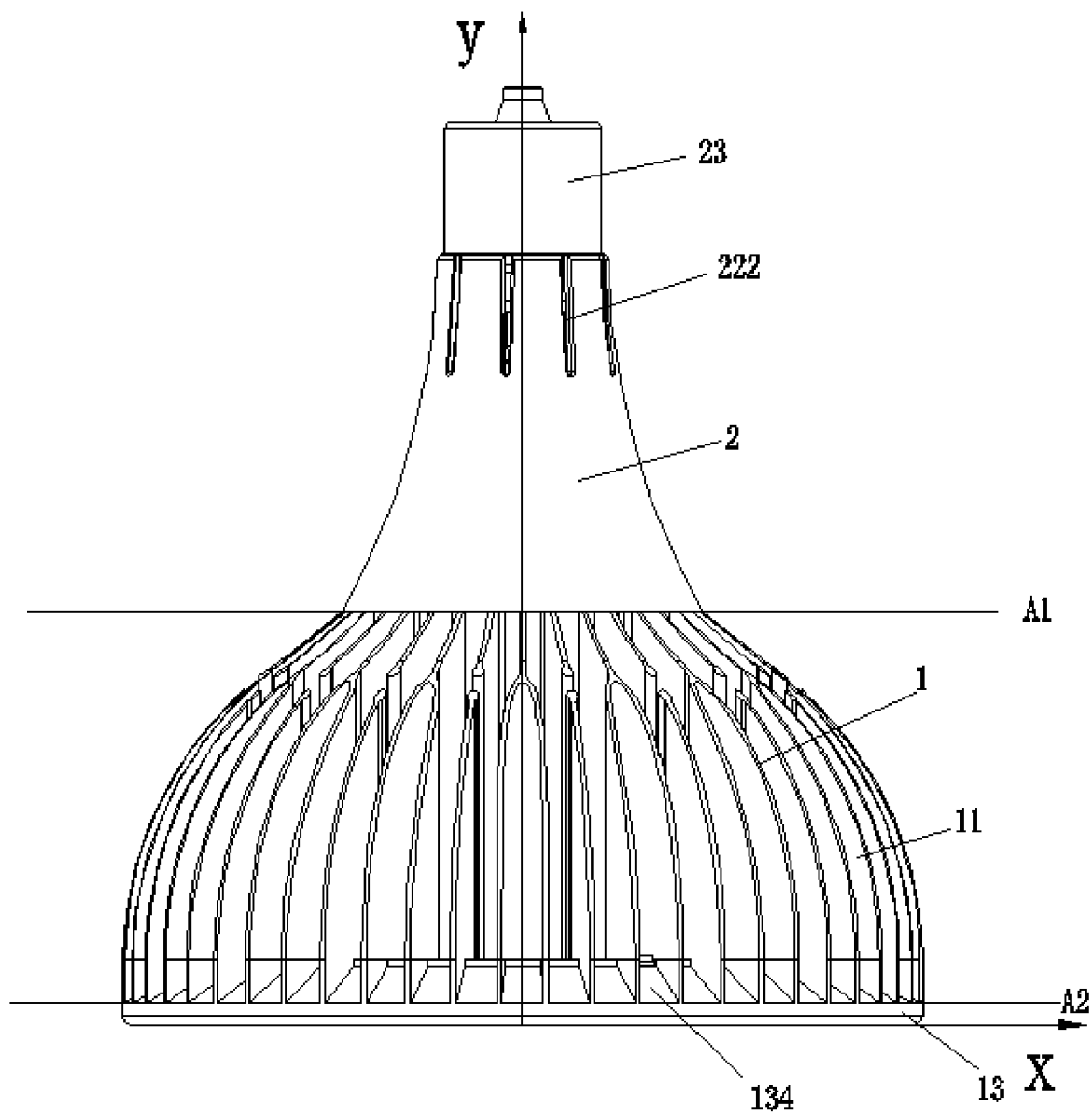
FIG. 1 is a structural schematic view of one embodiment of an LED lamp according to aspects of the invention.
Figure 2:
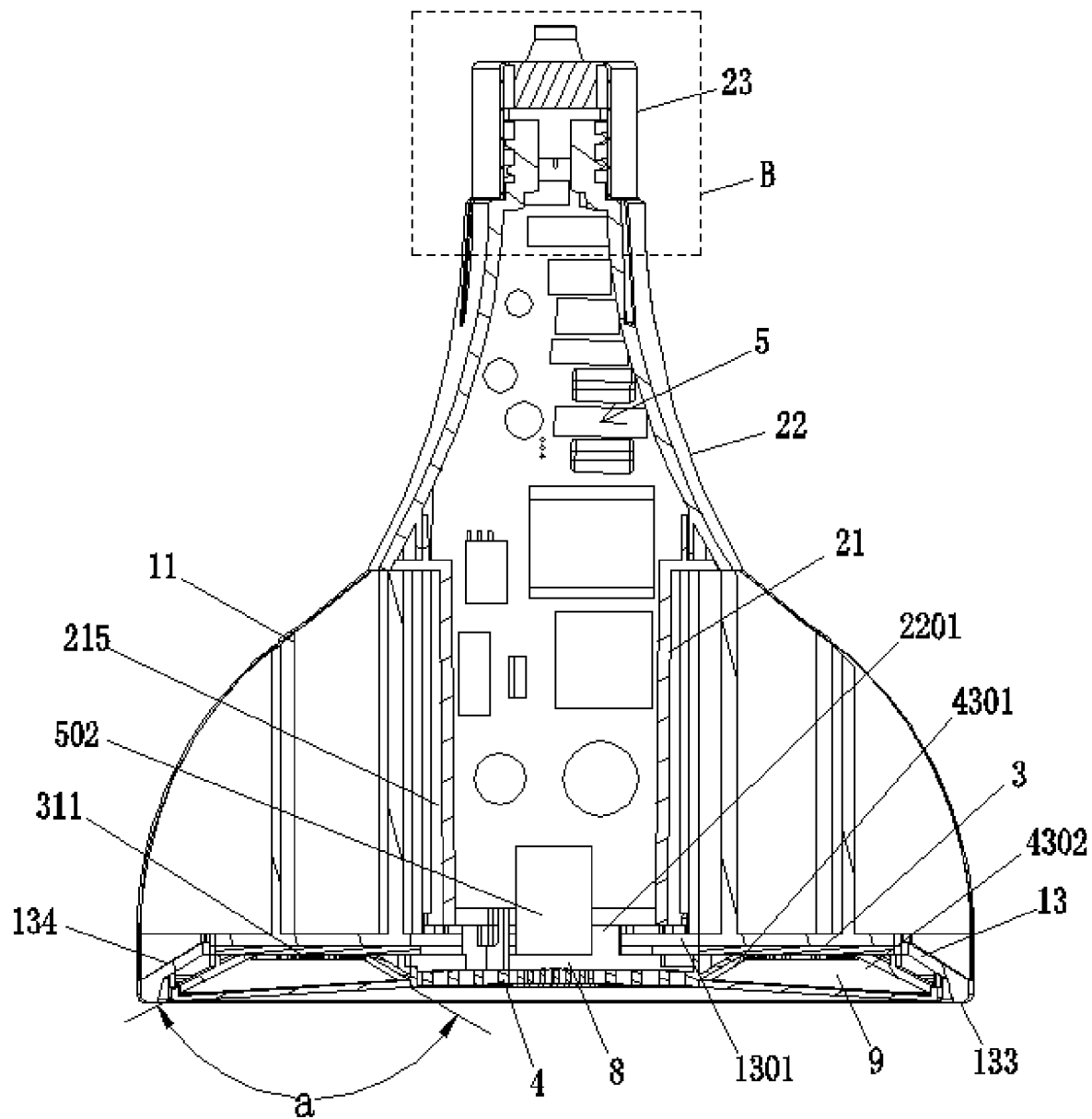
FIG. 2 is a schematic cross-sectional view of the LED lamp of FIG. 1.
Figure 3:
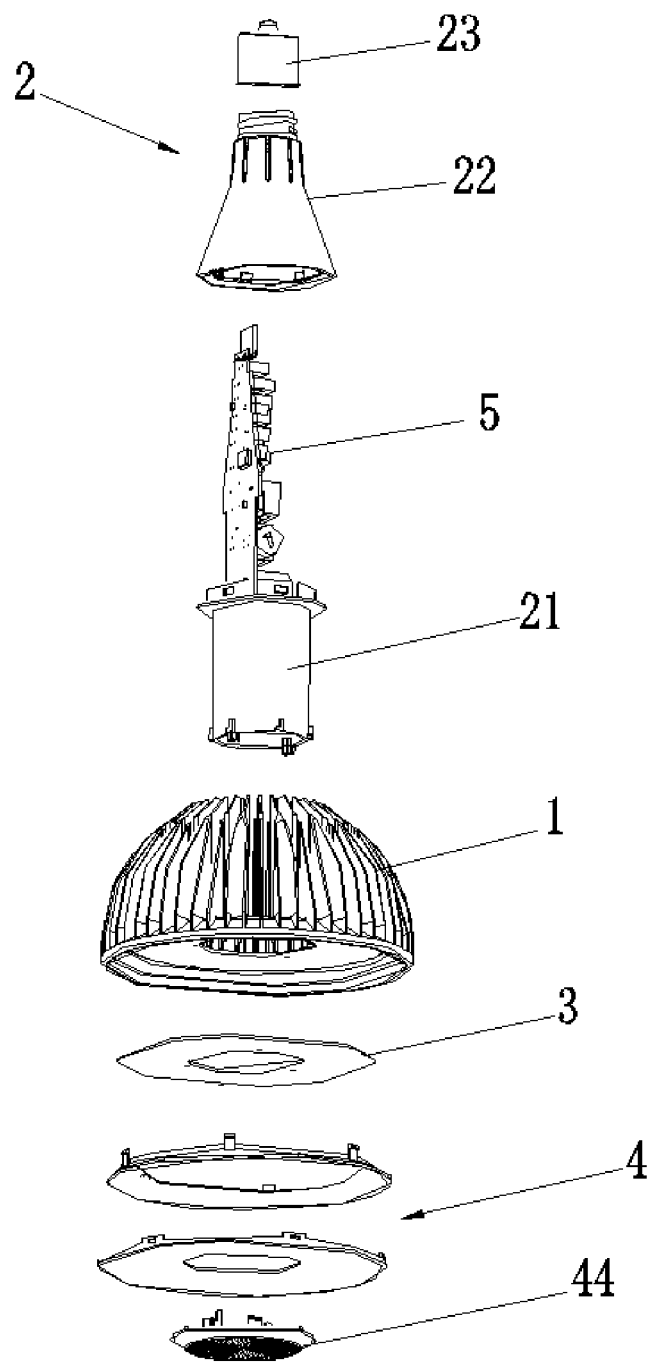
FIG. 3 is an exploded view of the LED lamp of FIG. 1.

FIG. 1 is a structural schematic view of an embodiment of an LED lamp according to certain aspects of the invention. FIG. 2 is a schematic cross-sectional view of the LED lamp of FIG. 1. FIG. 3 is an exploded view of the LED lamp of FIG. 1. As shown in the figures, the LED lamp includes a heat sink 1, a lamp shell 2, a light board 3, a lamp cover 4 and a power source 5. In this embodiment, the light board 3 is connected to the heat sink 1 by attachment for rapidly transferring heat from the light board 3 to the heat sink 1 when the LED lamp is working. In some embodiments, the light board 3 is riveted to the heat sink 1. In some embodiments, the light board 3 is screwed to the heat sink 1. In some embodiments, the light board 3 is welded to the heat sink 1. In some embodiments, the light board 3 is adhered to the heat sink 1. In this embodiment, the lamp shell 2 is connected to the heat sink 1, the lamp cover 4 covers the light board 3 to make light emitted from the light board 3 pass through the lamp cover to project out. The power source 5 is located in a chamber of the lamp shell 2 and the power source 5 is EC to the LED chips 311 for providing electricity.

Figure 4:
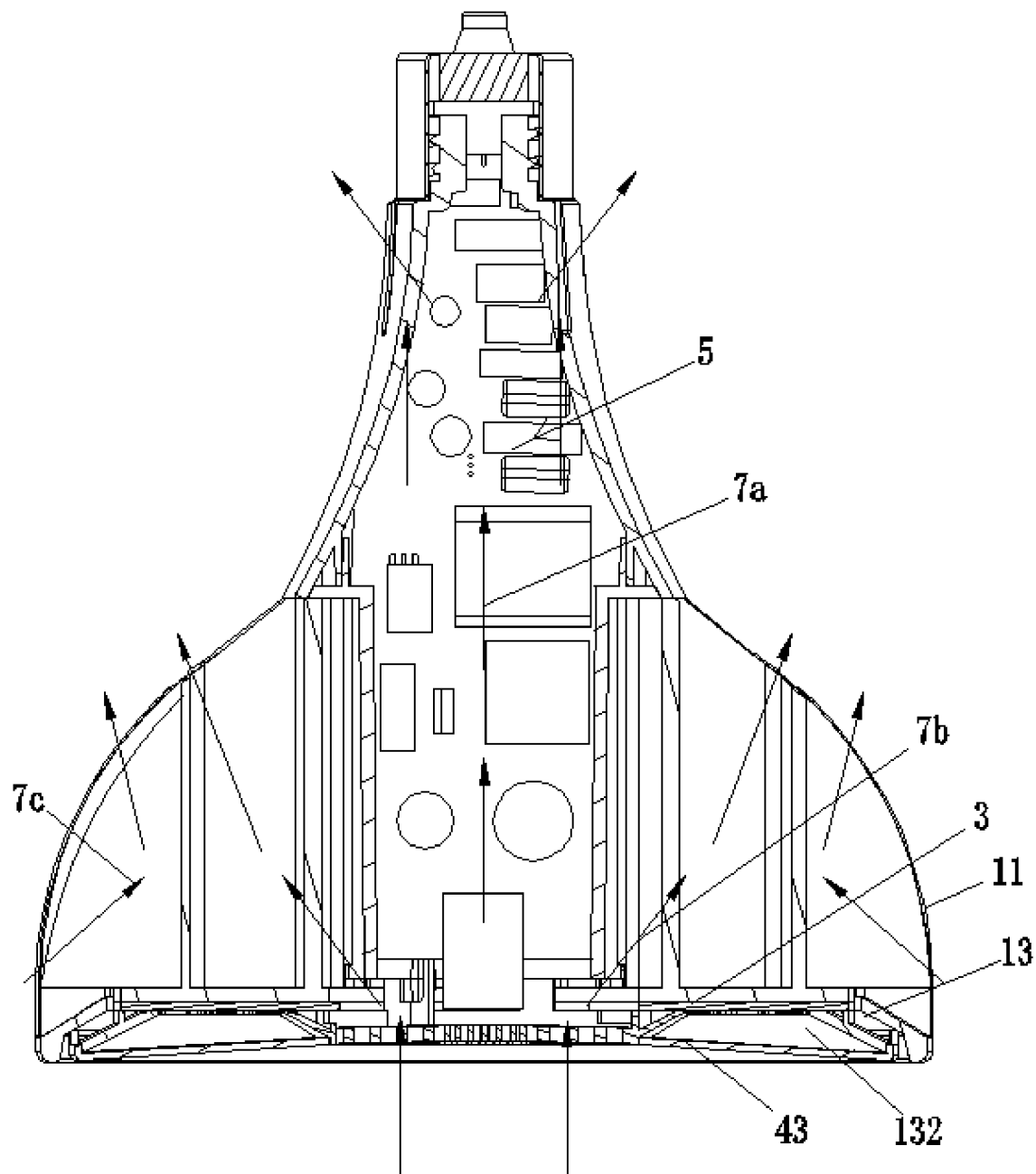
FIG. 4 is a schematic cross-sectional view of the LED lamp of FIG. 1, which shows the first heat dissipating channel and the second heat dissipating channel.

FIG. 4 is a schematic cross-sectional view of the LED lamp. As shown in FIGS. 2 and 4, the chamber of the lamp shell 2 of this embodiment is formed with a first heat dissipating channel 7a. An end of the first heat dissipating channel is formed with a first air inlet 2201. An opposite end of the lamp shell 2 is formed with a venting hole 222 (at an upper portion of the lamp neck 22). Air flows into the first heat dissipating channel 2201 and flows out from the venting hole 222 for bringing out heat in the first heat dissipating channel 7a (primarily, heat of the working power source 5). As for the path of heat dissipation, heat generated from the heat-generating components of the working power source 5 is transferred to air (around the heat-generating components) in the first heat dissipating channel 7a by thermal radiation first, and then external air enters the first heat dissipating channel 7a by convection to bring out internal air to make heat dissipation.

As shown in FIGS. 1, 2 and 4, a second heat dissipating channel 7b is formed in the fins and the base 13 of the heat sink 1. The second heat dissipating channel 7b has a second air inlet 1301. In this embodiment, the first air inlet 2201 and the second air inlet 1301 share the same opening formed on the light board 3. This will be described in more detail later. Air flows from outside of the LED lamp into the second air inlet 1301, passes through the second heat dissipating channel 7b and finally flows out from spaces between the fins 11 so as to bring out heat of the fins 11 to enhance heat dissipation of the fins 11. As for the path of heat dissipation, heat generated from the LED chips is conducted to the heat sink 1, the fins 11 of the heat sink 1 radiate the heat to surrounding air, and convection is performed in the second heat dissipating channel 7b to bring out heated air in the heat sink 1 to make heat dissipation.

As shown in FIGS. 1 and 4, the heat sink 1 is provided with a third heat dissipating channel 7c formed between adjacent two of the fins 11 or in a space between two sheets extending from a single fin 11. A radial outer portion between two fins 11 forms an intake of the third heat dissipating channel 7c. Air flows into the third heat dissipating channel 7c through the radial outer portion of the LED lamp to bring out heat radiated from the heat sink 11 to air.

Figure 5:
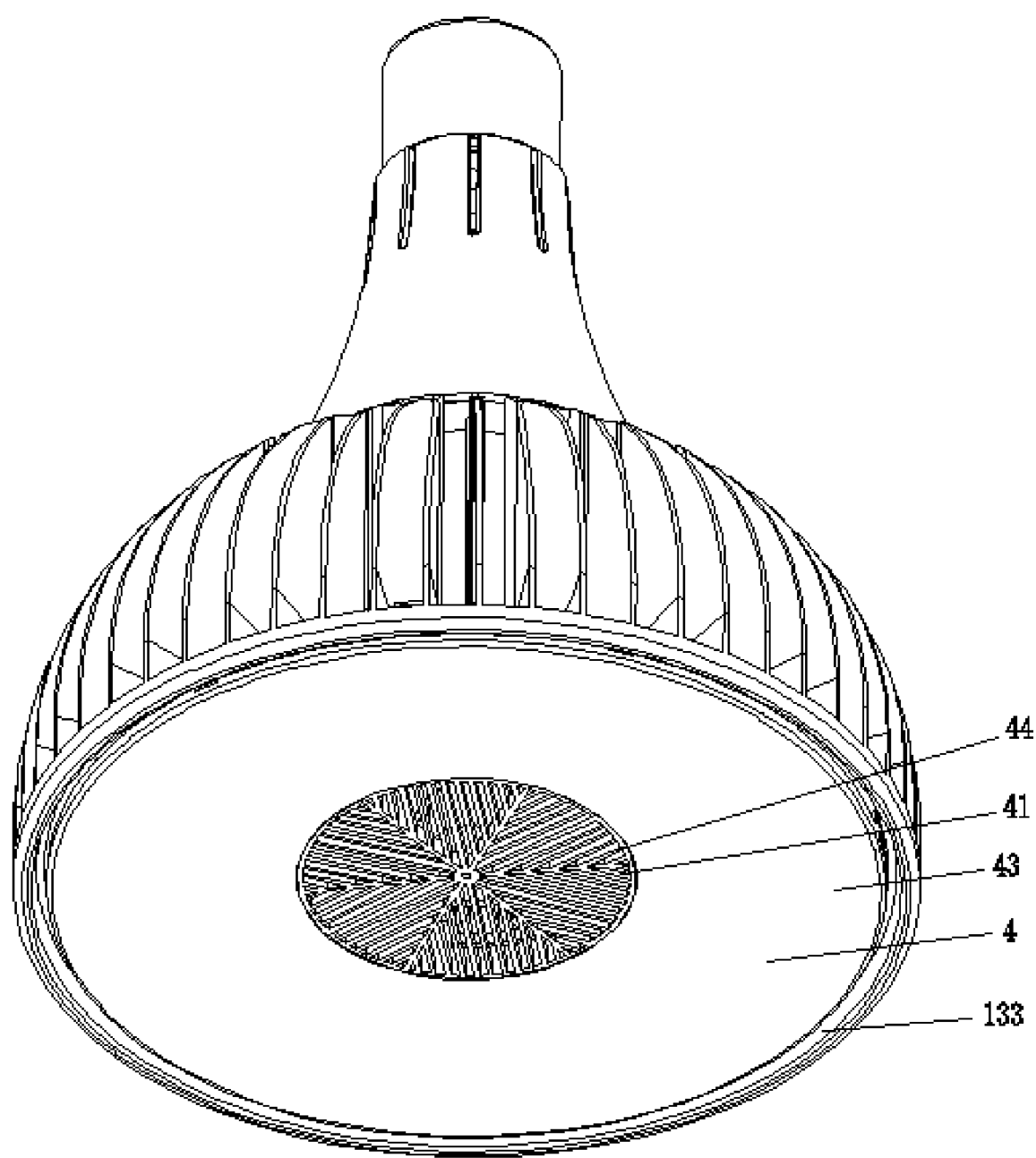
FIG. 5 is a perspective view of the LED lamp of FIG. 1.
Figure 6:
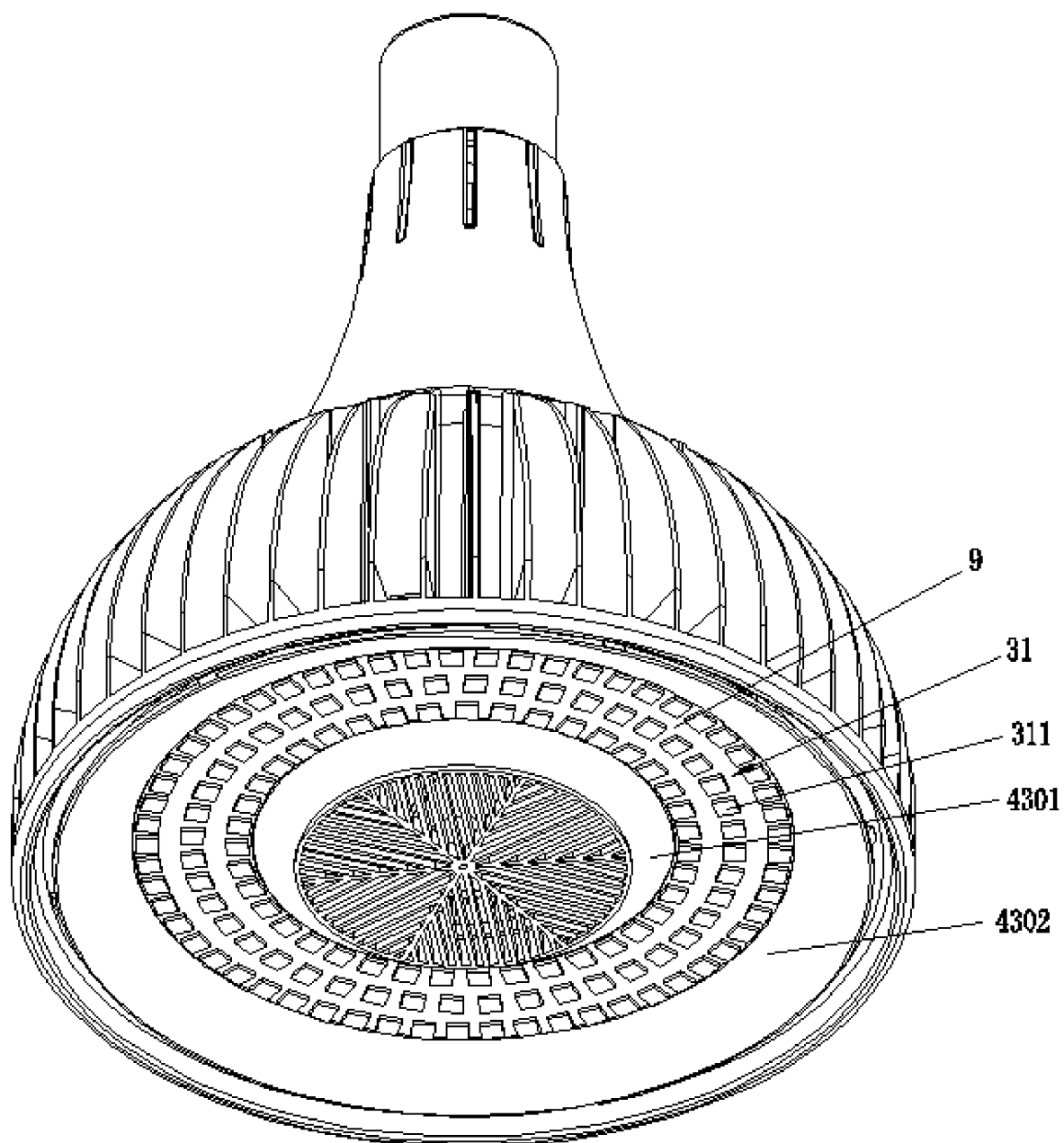
FIG. 6 is a structural schematic view of FIG. 5 without the light output surface.

FIG. 5 is a perspective view of the LED lamp of an embodiment, which shows assembling of the heat sink 1 and the lamp cover 4. FIG. 6 is a structural schematic view of FIG. 5 without the light output surface 43. As shown in FIGS. 5 and 6, in this embodiment, the lamp cover 4 includes a light output surface 43 and an end surface 44 with a vent 41. Air flows into both the first heat dissipating channel 7a and the second heat dissipating channel 7b through the vent 41. When the LED chips 311 (shown in FIG. 6) are illuminated, the light passes through the light output surface 43 to be projected from the lamp cover 4. In this embodiment, the light output surface 43 may use currently available light-permeable material such as glass, PC, etc. The term "LED chip" mentioned in all embodiments of the invention means all light sources with one or more LEDs (light emitting diodes) as a main part, and includes but is not limited to an LED bead, an LED strip or an LED filament. Thus, the LED chip mentioned herein may be equivalent to an LED bead, an LED strip or an LED filament.

As shown in FIGS. 5 and 6, in this embodiment, an inner reflecting surface 4301 is disposed inside the light output surface 43 of the lamp cover 4. The inner reflecting surface 4301 is disposed in the inner circle of the array of LED chips 311. In an embodiment, an outer reflecting surface 4302 is disposed in the outer circle of the array of LED chips 311. The outer reflecting surface 4302 corresponds to the LED chips 311 on the light board 3. The arrangement of both the inner reflecting surface 4301 and the outer reflecting surface 4302 is used for adjusting a light emitting range of the LED chip set 31 to make the light concentrated and to increase brightness in a local area. For example, under the condition of the same luminous flux, illuminance of the LED lamp can be increased. In one example, all the LED chips 311 in this embodiment are mounted on the bottom side of the light board 3 (in a using status). In this embodiment, the LED lamp of the present embodiment do not emit lateral light from the LED chips 311. When working, the primary light emitting surfaces of the LED chips 311 are completely downward. At least 60% of the light from the LED chips 311 are emitted through the light output surface 43 without reflection. As a result, in comparison with those LED lamps with lateral light (the lateral light is reflected by a cover or a lampshade to be emitted downward, and in theory there must be part of light loss in the process of reflection.) The LED chips 311 in this embodiment possess better light emitting efficiency. In one example, under the condition of the same lumen value (luminous flux), the LED lamp in the present embodiment possesses higher illuminance. And the emitted light can be concentrated to increase illuminance in a local area by the arrangement of both the inner reflecting surface 4301 and the outer reflecting surface 4302, for example, in an area under the LED lamp between 120 degrees and 130 degrees (a light emitting range under the LED lamp between 120 degrees and 130 degrees). When the LED lamp is installed at a relatively high position, in the same angular range of light emitting, the lit area of the LED lamp still satisfies the requirement and illuminance in this area can be higher.

The inner reflecting surface 4301 is used for reflecting part of light emitted from the innermost LED chips 311 of the LED chip set 31. The outer reflecting surface 4302 is used for reflecting part of light emitted from the outermost LED chips of the LED chipset 31. The outermost LED chips 311 are greater than the innermost LED chips 311 in number. The outer reflecting surface 4302 is greater than the inner reflecting surface 4301 in area. Because the outermost portion of the LED chip set 31 includes more LED chips than the innermost portion, larger reflecting area is beneficial to regulate light output.

Figure 8:
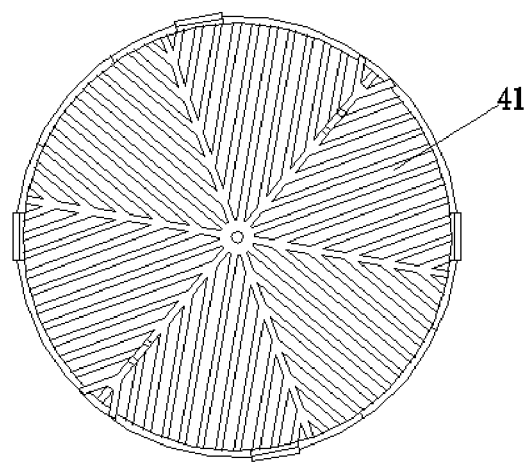
FIG. 8 is a schematic view of an end surface of the lamp cover of an embodiment.

FIG. 8 is a schematic view of an end surface 44 of the lamp cover 4 of an embodiment. As shown, the ratio of a total of cross-sectional area of the vent 41 to overall area of the end surface 44 (area of a single side of the end surface 44, such as the side away from the LED chips 311) is 0.01~0.7. Preferably, the ratio of a total of cross-sectional area of the vent 41 to overall area of the end surface 44 is 0.3~0.6. More preferably, the ratio of a total of cross-sectional area of the vent 41 to overall area of the end surface 44 is 0.4~0.55. By limiting the ratio of a total of cross-sectional of the vent 41 to overall area of the end surface 44 to the above ranges, not only can air intake of the vent 41 be guaranteed, but also adjustment of area of the vent 41 is implemented under ensuring structural strength of the end surface 44. When the ratio of area of the vent 41 to area of the end surface 44 is 0.4~0.55, not only can air intake of the vent 41 be guaranteed to satisfy requirements of heat dissipation of the LED lamp, but also the vent 41 does not affect structural strength of the end surface 44 to prevent the end surface 44 with the vent 41 from being fragile due to collision or pressure.

As shown in FIG. 8, a diameter of a maximum inscribed circle of the vent 41 is less than 2 mm, preferably, 1.0~1.9.mm. As a result, both bugs and most dust can be resisted, and venting efficiency of the vent 41 can be kept great enough. In one example, alternatively, the vent 41 defines both a length direction and a width direction, i.e. the vent has a length and a width, and the length is greater than the width. The largest width of inscribed circle of the vent 41 may be less than 2 mm. In an embodiment, the largest width is from 1 mm to 1.9 mm. In addition, the largest width of the vent 41 may be greater than 1 mm. If the width of the vent 41 is less than 1 mm, then more pressure is required to push air to enter the vent 41, which is advanced for venting.

Figure 9A:
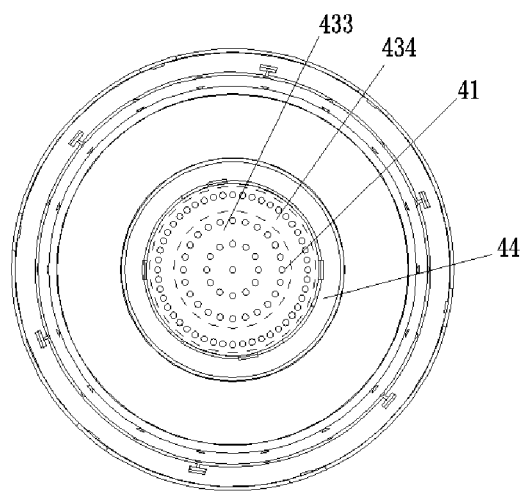
FIGS. 9A~9G are schematic views of some embodiments of the lamp cover.
Figure 9B:
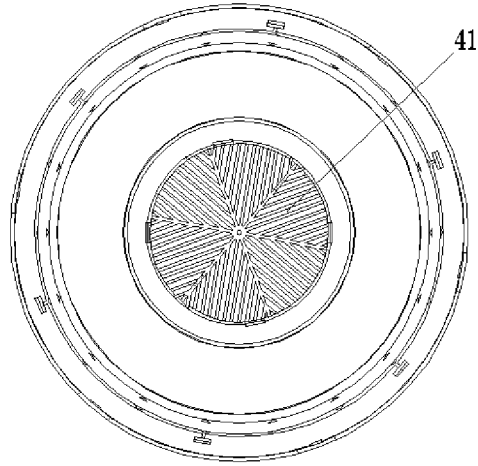
Figure 9C:
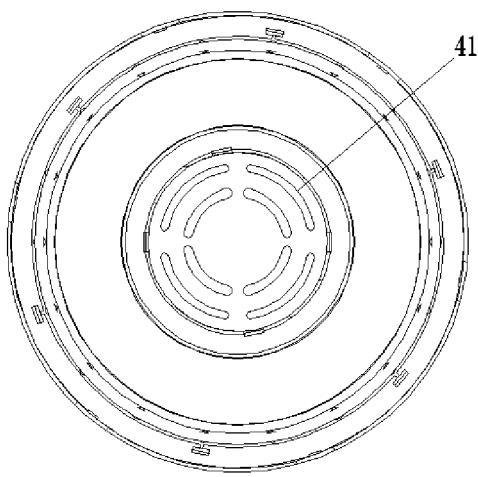
Figure 9D:
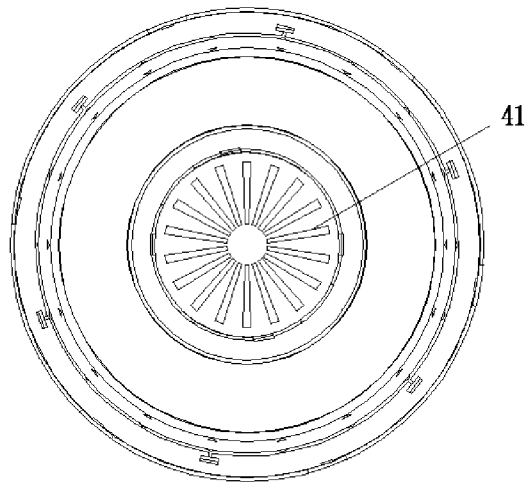
Figure 9E:
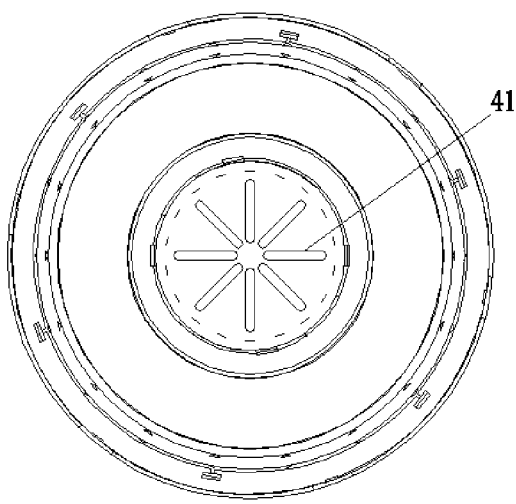
Figure 9F:
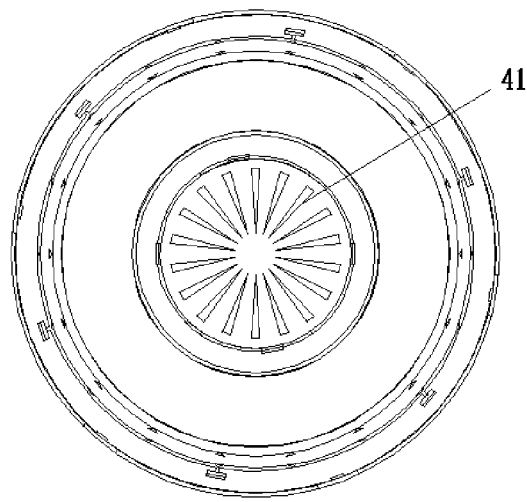
Figure 9G:
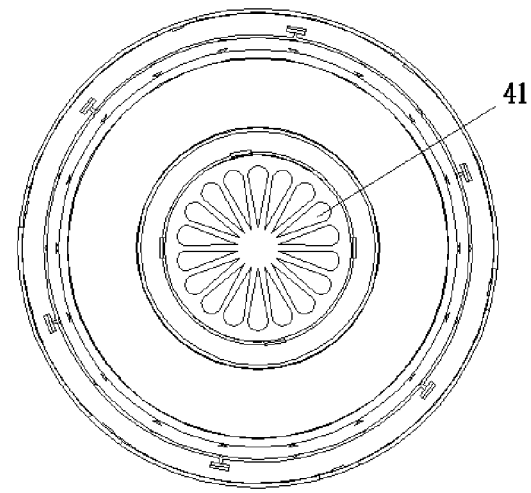

FIGS. 9A~9G show shapes of some embodiments of the vent 41. As shown in FIGS. 9A-9G, the vent 41 may be circular, strip-shaped, arced, trapezoidal, diamond or their combination. As shown in FIG. 9A, when the vent 41 is configured to be circular, its diameter should be less than 2 mm to resist bugs and most dust and venting efficiency of the vent 41 can be kept great enough. As shown in FIGS. 9B and 9C, when the vent 41 is configured to be strip-shaped or arced, its width should be less than 2 mm to accomplish the above effects. As shown in FIG. 9D, when the vent 41 is configured to be trapezoidal, its lower base should be less than 2 mm to accomplish the above effects. As shown in FIG. 9E, when the vent 41 is configured to be round-cornered rectangular, its width should be less than 2 mm to accomplish the above effects. As shown in FIGS. 9F and 9G, when the vent 41 is configured to be triangular or drop-shaped, a diameter of its maximum inscribed circle should be less than 2 mm.

In some embodiments, the vent 41 on the end surface 44 is multiple in number. For example, the vents 41 may be annularly arranged on the end surface 44 for even air intake. The vents 41 may also be radially arranged on the end surface 44. The vents 41 may also be irregularly arranged.

In FIG. 9A, there are two broken lines on the end surface 44. The inner broken line represents a position the first air inlet 2201 (as shown in FIG. 2) is projected onto the end surface 44. The region within the inner broken line is defined as a first portion (first opening region 433). The region between the inner circle and the outer circle is defined as a second portion (second opening region 434). In this embodiment, the first air inlet 2201 is projected onto the end surface in an axis of the LED lamp to occupy an area on the end surface 44, it is the first portion (first opening region 433). The other area on the end surface 44 is the second portion (second opening region 434). The vent 41 in the first portion is greater than the vent 41 in the second portion in area. Such an arrangement is advantageous to making most air flow into the first heat dissipating channel 7a for better effect of heat dissipation to the power source 5 and reduction of rapidly aging of electronic components of the power source 5. These features are also available to the vent 41 in other embodiments.

In other embodiments, the first air inlet 2201 is projected onto the end surface 44 in an axis of the LED lamp to occupy an area on the end surface 44, which may be a first portion (first opening region 433). The other area on the end surface 44 may be a second portion (second opening region 434). The vent 41 in the first portion is smaller than the vent 41 in the second portion in area. As a result, heat of the fins 11 can be better dissipated to perform better heat dissipation to the LED chips 311 and prevent a region around the LED chips 311 from forming high temperature. In detail, area of both the first portion and the second portion can be selected according to actual requirements.

In some applications, there may be a limit of overall weight of an LED lamp. For example, when an LED lamp adopts an E39 head, its maximum weight limit is 1.7 Kg. Thus, besides the fundamental elements such as a power source, a lamp cover and a lamp shell, in some embodiments, weight of a heat sink is limited within 1.2 Kg. For some high-power LED lamps, the power is about 150 W~300 W, and their luminous flux can reach 20000 lumens to 45000 lumens. Under a limit of weight, a heat sink should dissipate heat from an LED lamp with 20000~45000 lumens. Under a condition of heat dissipation of natural convection, usually power of 1 W needs area of heat dissipation of at least 35 square cm. The following embodiments intend to reduce area of heat dissipation for power of 1 W under guarantee of a receiving space of the power source 5 and effect of heat dissipation. Under a precondition of weight limit of the heat sink 1 and limit of the power source 5, the best effect of heat dissipation can be accomplished.

Figure 19A:
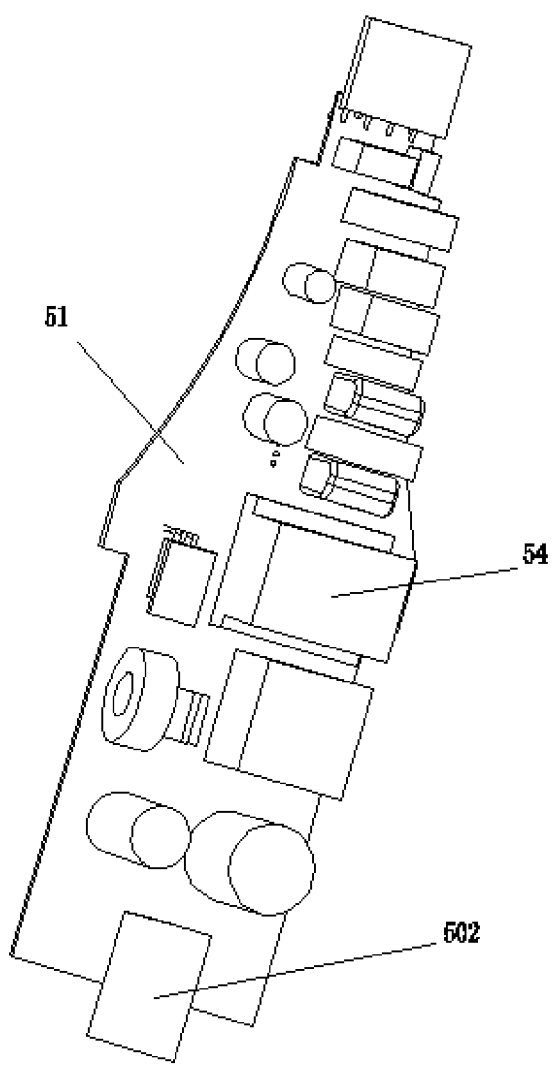

As shown in FIGS. 1 and 2, in this embodiment, the LED lamp includes passive heat dissipating elements which adopt natural convection and radiation as a heat dissipating manner without any active heat dissipating elements such as a fan. The passive heat dissipating element in this embodiment includes a heat sink 1 composed of fins 11 and a base 13. The fins 11 radially extend from and connect to the base 13. When using the LED lamp, at least part of heat from the LED chips 311 is conducted to the heat sink 1 by thermal conduction. At least part of heat occurring from the heat sink 1 is transferred to external air by thermal convection and radiation. A diameter of a radial outline of the heat sink 1, in a hanging status as shown in the figures, tapers off upward or is substantially in a taper shape for a better match with a lampshade. When the heat sink 1 in this embodiment is dissipating heat, at least part of heat is thermally radiated to air therearound to perform heat dissipation. An important factor of thermal radiation is emissivity. To improve emissivity of the heat sink 1, surfaces of the heat sink in this embodiment are specially treated. For example, surfaces of the heat sink 1 are provided with radiation heat-dissipating paint or electrophoretic coating to increase efficiency of thermal radiation and to rapidly dissipate heat of the heat sink 1. Another solution is forming a nanostructured porous alumina layer on the surfaces of the fins 11 by anodization in an electrolyte to form a layer of nanostructured porous alumina. As a result, ability of heat dissipation of the fins 11 can be enhanced without adding the number of the fins 11. Alternatively, the surfaces of the fins 11 may be coated with an anti-thermal-radiation layer to reduce thermal radiation between the fins 11. This can make more heat radiate to air. The anti-thermal-radiation layer may adopt paint or oxide coating, in which the paint may be normal paint or radiation heat dissipation paint. To further enhance heat dissipating effect of the heat sink 1. Preferably, it further contains aluminum such as a small or micro amount of aluminum. Adopting both zinc and magnesium with the above percentages can form $MgZn_2$ with a reinforcement effect. This makes a heat treatment effect of the heat sink 1 far better than a one zinc binary alloy. Tensile strength can be significantly increased. Both resistance to stress corrosion and flaking corrosion resistance also increases. Performance of thermal conduction also increases. In sum, performance of heat dissipation of the heat sink 1 is better. In addition, the heat sink 1 may be made of a material with low thermal resistance/high thermal conductivity, such as an aluminum alloy. In some embodiments, the heat sink 1 can be made of an anodized 6061 T6 aluminum alloy with thermal conductivity k=167 W/m·k. and thermal emissivity e=0.7. In other embodiments, other materials are available, such as a 6063 T6 or 1050 aluminum alloy with thermal conductivity k=225 W/m·k. and thermal emissivity e=0.9. In other embodiments, other alloys are still available, such as AL 1100, etc. In some embodiments, a die casting alloy with thermal conductivity is available. In other embodiments, the heat sink 1 may include other metals such as copper. FIG. 19A is a cross-sectional view of the heat sink 1 of an embodiment. As shown, in some embodiments, the heat sink 1 is added with a heat dissipating pillar 12. In detail, the heat sink 1 includes a heat dissipating pillar 12, fins 11 and a base 13. The heat dissipating pillar 12 connects to the base 13. The fins 11 are radially disposed around the heat dissipating pillar 12. A root portion of the fins 11 connects to the base 13 on a circle around the heat dissipating pillar 12. The heat dissipating pillar 12 supports the fins 11 to prevent the fins 11 from being skewed in machining. When using the LED lamp, the heat dissipating pillar 12 or the base 13 transfers heat from the LED chips 311 to the fins 11. The heat dissipating pillar 12 is a hollow body with two opening ends, for example, the heat dissipating pillar 12 may be a hollow cylinder. The heat dissipating pillar 12 may be made of a material which is the same as the heat sink 1. This material possesses great thermal conductivity, such as an alloy, to implement light weight and low cost. In other embodiments, the heat dissipating pillar 12 may be made of copper to enhance thermal conductivity of the heat sink 1 and implement rapid heat transfer.

As shown in FIGS. 2, 4 and 5, a gap is kept between the end side 44 and the light board 3 to form a room 8. The room 8 communicates with both the first air inlet 2201 of the first heat dissipating channel 7a and the second air inlet 1301 of the second heat dissipating channel 7b. Air flows into the room 8 through the vent 41 of the end side 44 and then flows into both the first heat dissipating channel 7a and the second heat dissipating channel 7b. The room 8 allows air therein to mix and the mixed air is distributed according to negative pressure (resulting from temperature difference) of both the first and second heat dissipating channels 7a, 7b so as to make distribution of air more reasonable.

Figure 12:
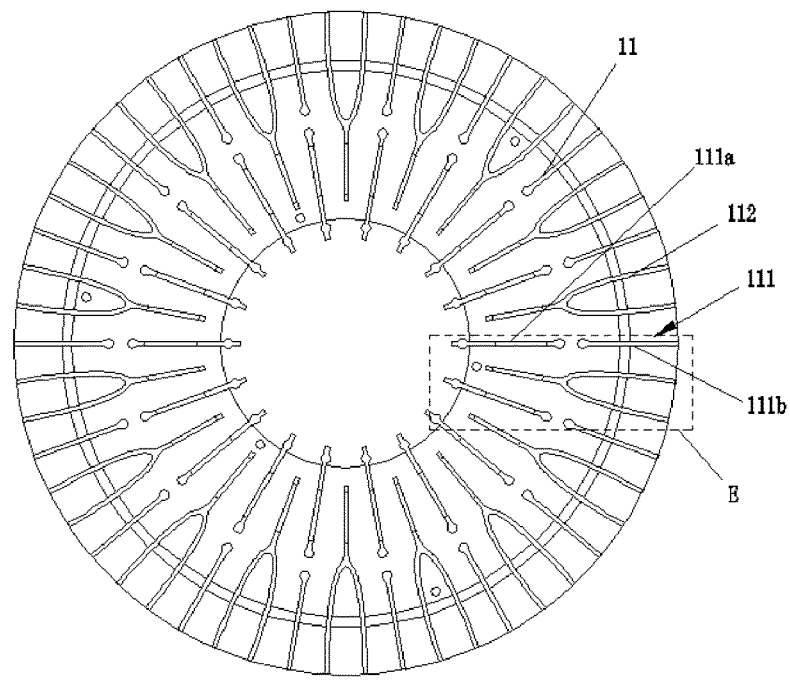
FIG. 12 is a top view of the heat sink of the LED lamp of FIG. 10.

FIG. 12 is top view of the heat sink 1 of the LED lamp of an embodiment. As shown, the heat sink 1 suffers the above volume limit, so at least part of the fins 11 are extended outward in a radial direction of the LED lamp with at least two sheets at an interval. By such an arrangement, the fins 11 in a fixed space can have larger area of heat dissipation. In addition, the extended sheets form support to the fins 11 to make the fins firmly supported on the base 13 to prevent the fins 11 from deflecting.

In detail, as shown in FIG. 12, the fins include first fins 111 and second fins 112. The bottoms of both the first fins 111 and the second fins 112 in an axis of the LED lamp connect to the base 13. The first fins 111 interlace with the second fins 112 at regular intervals. Being projected from the axial direction of the LED lamp, each of the second fins 112 is to be seen as a Y-shape. Such Y-shaped second fins 112 can have more heat dissipating area under a condition of the heat sink 1 occupying the same volume. In this embodiment, both the first fins 111 and the second fins are evenly distributed on a circumference, respectively. Every adjacent two of the second fins 112 are symmetrical about one of the first fins 111. In this embodiment, an interval between one of the first fins 111 and adjacent one of the second fins 112 is 8~12 mm. In general, to make air flow in the heat sink 1 smooth and to make the heat sink perform a maximum effect of heat dissipation, intervals between the fins 11 should be as uniform as possible.

As shown in FIGS. 6 and 12, at least one of the fins 11 is divided into two portions in a radial direction of the LED lamp. Thus, a gap between the two portions forms a passage to allow air to pass. In addition, the projecting area of the gap directly exactly corresponds to an area that the LED chips 311 are positioned on the LED board 3 to enhance convection and improve an effect of heat dissipation to the LED chips 311. In an aspect of limited overall weight of the LED lamp, part of the fins 11 divided with a gap reduces the amount of the fins 11, decreases overall weight of the heat sink 1, and provides a surplus space to accommodate other elements.

Figure 13:
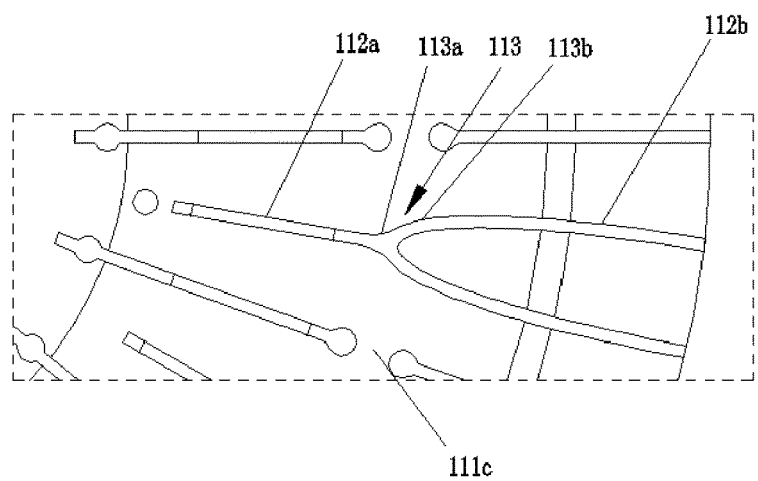
FIG. 13 is an enlarged view of portion E in FIG. 12.
Figure 14:
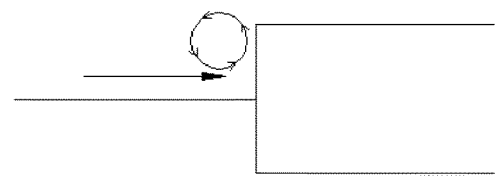
FIG. 14 is a schematic view showing a vortex formed by air near the second fins according to another embodiment of the present invention.

FIG. 13 is an enlarged view of portion E in FIG. 12. As shown in FIGS. 12 and 13, the fins 11 includes first fins 111 and second fins 112. Each of the first fins 11 is divided into two portions in a radial direction of the LED lamp, i.e. a first portion 111a and a second portion 111b. The two portions are divided with a gap portion 111c. The first portion 111a is located inside the second portion 111b in a radial direction. Each of the second fins 112 has a third portion 112a and a fourth portion 112b extending therefrom. The fourth portions 112b are located radially outside the third portions 112a to increase space utilization and make the fins have more heat dissipating are for heat dissipation. As shown in FIG. 13, the third portion 112a is connected to the fourth portion 112b through a transition portion 113. The transition portion 113 has a buffer section 113a and a guide section 113b. At least one or both of the buffer section 113a and the guide section 113b are arced in shape. In other embodiment, both the buffer section 113a and the guide section 113b are formed into an S-shape or an inverted S-shape. The buffer section 113a is configured to prevent air radially outward flowing along the second fins 112 from being obstructed to cause vortexes. Instead, the guide section 113b is configured to be able to guide convection air to radially outward flow along the second fins 112 without interference (as shown in FIG. 14).

As shown in FIG. 13, one of the second fins 112 includes a third portion 112a and two fourth portions 112b. The two fourth portions 112b are symmetrical about the third portion 112a. In other embodiments, one of the second fins 112 may include a third portion 112a and multiple fourth portions 112b such as three or four fourth portions 112b (not shown). The multiple fourth portions 112b of the second fin 112 are located between two first fins 111.

As shown in FIG. 13, a direction of any tangent of the guide section 113b is separate from the gap portion 111c to prevent convection air from flowing into the gap portion 111c through the guide portion 113b, such that the poor efficiency of heat dissipation caused by longer convection paths is able to be avoid as well. Preferably, a direction of any tangent of the guide section 113b is located radially outside the gap portion 111c. In other embodiments, a direction of any tangent of the guide section 113b is located radially inside the gap portion 111c.

Figure 15:
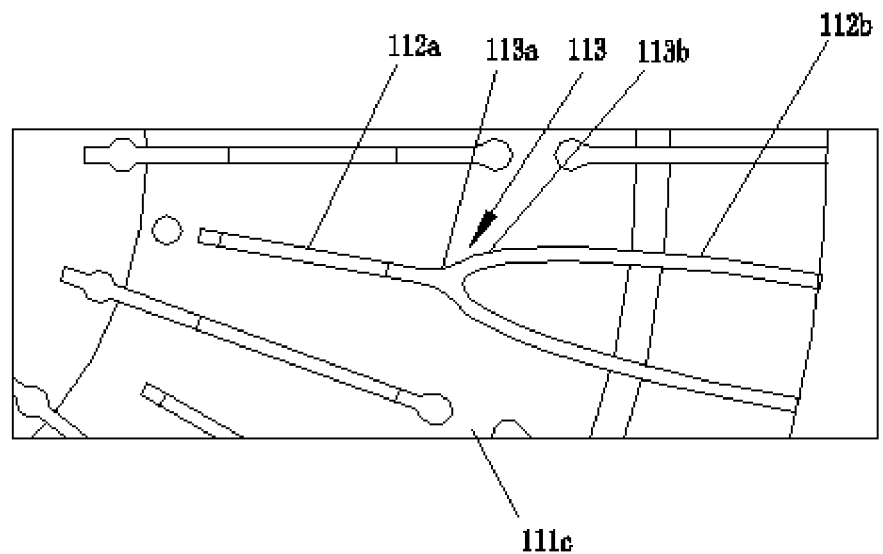
FIG. 15 is a partially schematic view of the heat sink of another embodiment.

As shown in FIG. 15, in another embodiment, a direction of any tangent of the guide section 113b falls in the gap portion 111c to make convection more sufficient but convection paths will increase.

Figure 10:
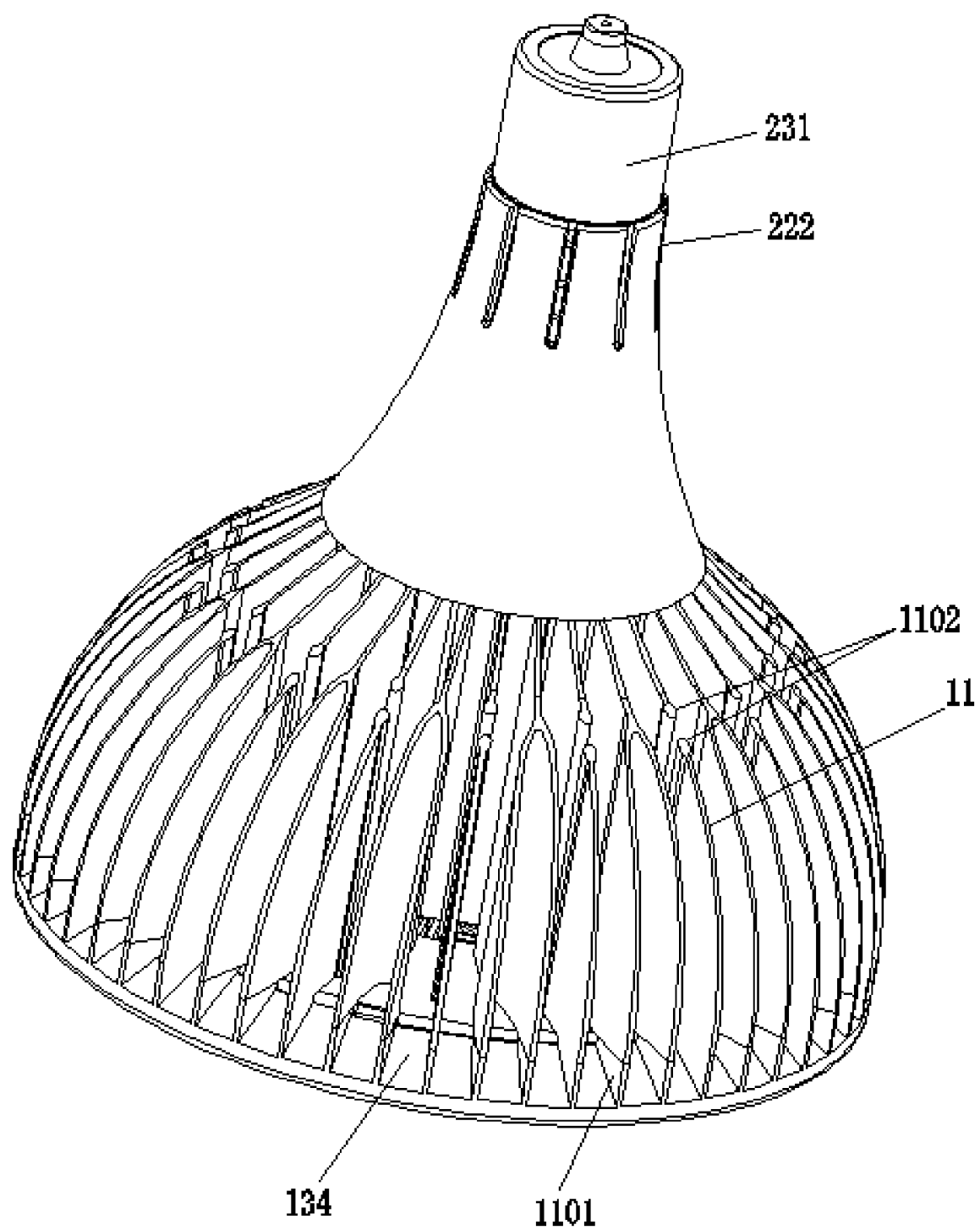
FIG. 10 is a perspective view of an LED lamp, according to another embodiment of the present invention.

As shown in FIG. 10, at least partially of fin 11 has a protrusion 1102 projecting from a surface of the fin 11. The protrusions 1102 extend along an axis of the LED lamp and are in contact with the base 13. A surface of the protrusion 1102 may selectively adopt a cylindrical shape or a regular or an irregular polygonal cylinder. The protrusions 1102 increase surface area of the fins 11 to enhance efficiency of heat dissipation. In addition, the protrusions 1102 also form a support effect to the fins 11 to prevent the fins 11 from being inflected in manufacture. In some embodiments, a single fin 11 is divided into two portions in a radial direction of the LED lamp. Each portion is provided with at least one protrusion 1102 to support the two portions. In this embodiment, the protrusion 1102 is located at an end portion of each fin 11 in a radial direction of the LED lamp, for example, at end portions of the first portions 111a, 111b (the ends near the gap portion 111c).

Figure 16:
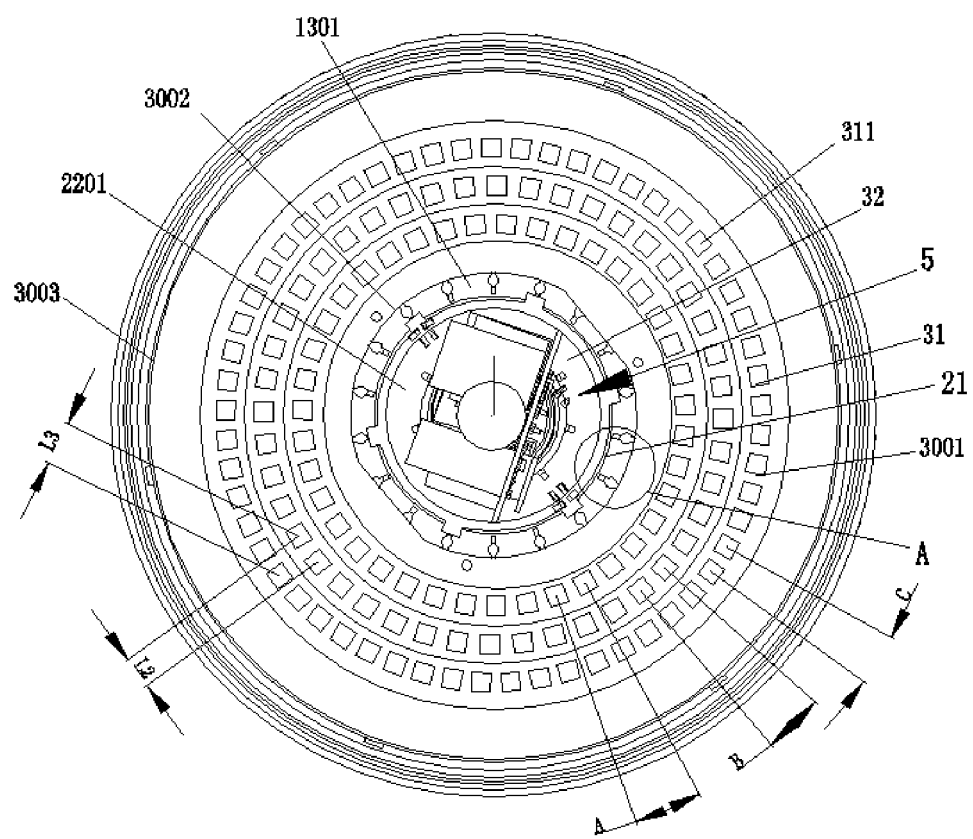
FIG. 16 is a bottom view of the LED lamp of FIG. 1 without the lamp cover.
Figure 17:
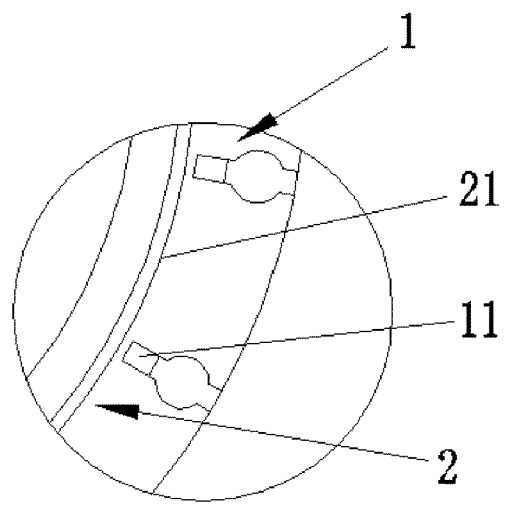
FIG. 17 is an enlarged view of portion A in FIG. 16.

FIG. 16 is a bottom view of the LED lamp of FIG. 1 without the lamp cover 4. FIG. 17 is an enlarged view of portion A in FIG. 16. As shown in FIGS. 16 and 17, the heat sink 1 is disposed outwardly of the sleeve 21, and the power source 5 is disposed in the inner space of the sleeve 21. A distance is kept between distal ends of the fins 11 and the sleeve 21. Accordingly, the sleeve 21 which has been heated to be thermally expanded will not be pressed by the fins 11 to be damaged. Also, heat from the fins 11 will not be directly conducted to the sleeve 21 to adversely affect electronic components of the power source 5 in the sleeve 21. Finally, air existing in the distance between the fins 11 and the sleeve 21 of the lamp shell 2 (as shown in FIG. 3) possesses an effect of thermal isolation so as to further prevent heat of the heat sink 1 from affecting the power source 5 in the sleeve 21. In other embodiments, to make the fins 11 have radial support to the sleeve 21, distal ends of the fins 11 may be in contact with an outer surface of the sleeve 21 and another part of the fins 11 are not in contact with the sleeve 21. Such a design may be applied in the LED lamp shown in FIG. 16. As shown in FIG. 16, the light board 3 includes a third aperture 32 for exposing both the first air inlet 2201 of the first heat dissipating channel 7a and the second air inlet 1301 of the second heat dissipating channel 7b. In some embodiments, to rapidly dissipate heat from the power source 5, the ratio of cross-sectional area of the first air inlet 2201 to cross-sectional area of the second air inlet 1301 is greater than 1 but less than or equal to 2. In some embodiments, to rapidly dissipate heat from the power source 5, the ratio of cross-sectional area of the second air inlet 1301 to cross-sectional area of the first air inlet 2201 is greater than 1 but less than or equal to 1.5.

Figure 11:
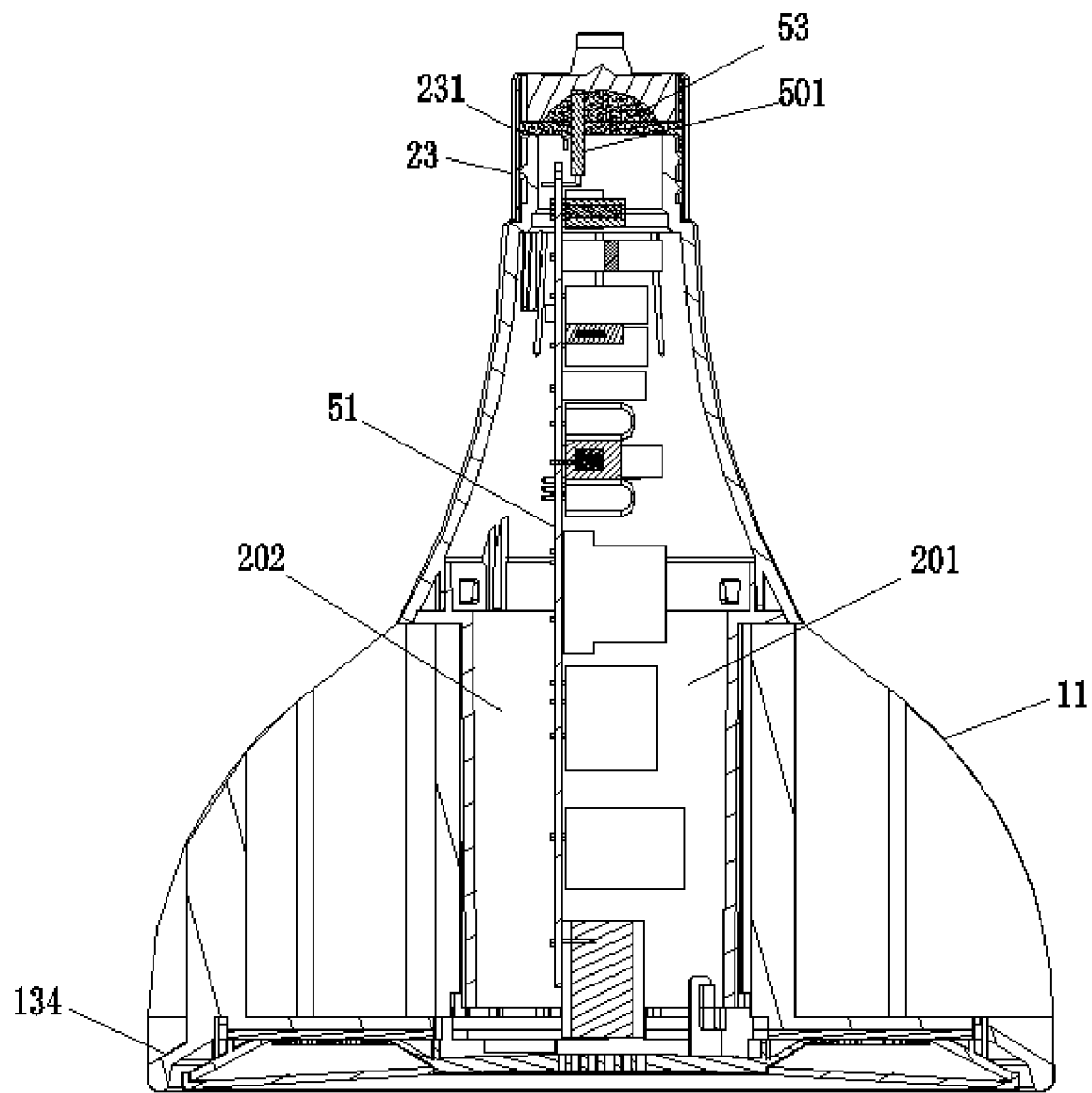
FIG. 11 is a cross-sectional view of the LED lamp of FIG. 10.

As shown in FIGS. 10 and 11, the innermost of the fins 11 in a radial direction of the LED lamp is located outside the venting hole 222 in a radial direction of the LED lamp. In one example, an interval is kept between the innermost of the fins 11 in a radial direction of the LED lamp and the venting hole 222 in a radial direction of the LED lamp. As a result, heat from the fins 11 flowing upward will not gather to the venting hole 222 to keep an interval with the venting hole 222. This avoids heat making air around the venting hole 222 heat up to affect convection temperature speed of the first heat dissipating channel 7a (the convection speed depends upon a temperature difference between two sides of the first heat dissipating channel 7a, when air temperature near the venting hole 222 rises, the convection speed will correspondingly slowdown.).

As shown in FIG. 16, in this embodiment, the light board 3 includes at least one LED chip set 31 having LED chips 311.

As shown in FIGS. 6 and 16, in this embodiment, the light board 3 is divided into three areas comprising an inner ring, a middle ring and an outer ring. All the LED chip sets 31 are located in the three areas. In one example, the inner ring, the middle ring and the outer ring are separately mounted by different amount of LED chip sets 31. In another aspect, the light board 3 includes three LED chip set 31. The three LED chip sets 31 are respectively located in the inner ring, the middle ring and the outer ring. Each of the LED chip sets 31 separately in the inner ring, the middle ring and the outer ring has at least one LED chip 311.

As shown in FIGS. 1 and 16, the light board 3 has an inner border 3002 and an outer border 3003. Both the inner border 3002 and the outer border 3003 separately upward extend along the axial direction of the LED lamp to form a region. An area of part of the fins 11 inside the region is greater than an area of part of the fins 11 outside the region. As a result, the most of the fins 11 can correspond to the light board 3 (a shorter heat dissipating path) to enhance heat dissipating efficiency of the fins 11 and increase effective area of heat conduction of the fins 11 to the LED chips 311.

As shown in FIGS. 4 and 16, the light board 3 is formed with a third aperture 32 separately communicating with the first heat dissipating channel 7a and the second heat dissipating channel 7b. For example, the third aperture 32 communicates with spaces between the fins 11 and the chamber of the lamp shell 2 to form air convection paths between the spaces between the fins 11 and between the chamber of the lamp shell 2 and the outside of the Led lamp. The third aperture 32 is located inside the inner ring of the LED lamp. Thus, it would not occupy the space of the reflecting region 3001 to affect reflective efficiency. In detail, the third aperture 32 is located at a central region of the light board 3 and both the first air inlet 2201 and the second air inlet 1301 make air intake through the same aperture (the third aperture 32). In one example, after convection air passes through the third aperture 32, and then enters the first air inlet 2201 and the second air inlet 1301. The third aperture 32 is located at a central region of the light board 3, so both the first air inlet 2201 and the second air inlet 1301 can commonly use the same air intake. Thus, this can prevent occupying an excessive region of the light board 3 and prevent the usable regional area of the light board 3 for disposing the LED chips 311 from decreasing due to multiple air intakes. On the other hand, the sleeve 21 corresponds to the third aperture 32, so convection air may have an effect of thermal isolation to prevent temperatures inside and outside the sleeve 21 from mutually affecting each other when air enters. In other embodiments, if both the first air inlet 2201 and the second air inlet 1301 are located at different positions, then the third aperture 32 may be multiple in number to correspond to both the first air inlet 2201 and the second air inlet 1301.

Figure 19B:
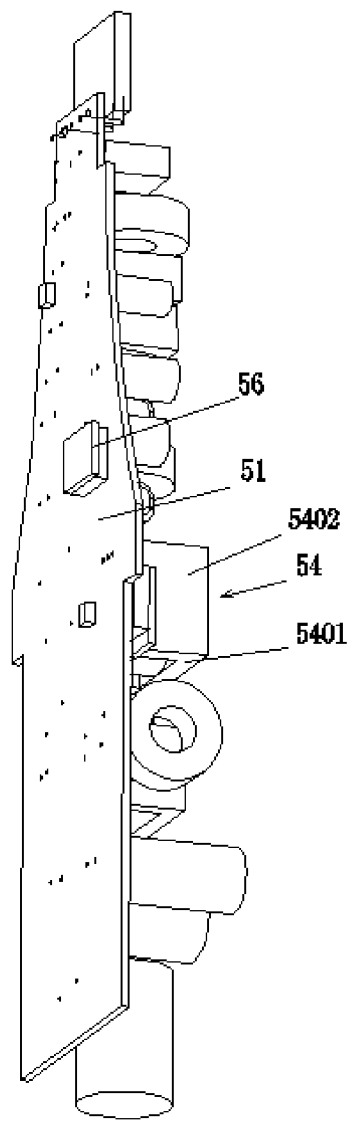

FIGS. 19A~19C are perspective views of the power source 5 of one embodiment at different viewpoints. FIG. 19D is a main view of the power source 5 of one embodiment. The power source 5 is electrically connected to the LED chips 311 to power the LED chips 311. As shown in FIGS. 19A~19C, the power source 5 includes a power board 51 and a plurality of electronic components mounted thereon.

As shown in FIG. 11, the power board 51 is parallel to the axis of the LED lamp. Thus, in the axial direction of the LED lamp, the power board 51 is divided into an upper portion and a lower portion. Arranging spaces of both the upper portion and the lower portion are identical or approximately identical to form better layout of the electronic components. Besides, if the power board 51 inclines toward the axis of the LED lamp, then air flow may be obstructed and it is disadvantageous to heat dissipation of the power source 5.

As shown in FIG. 11, the power board 51 divides an inner chamber of the lamp shell 2 into a first portion 201 and a second portion 202. The first portion 201 is greater than the second portion 202 in volume. When implementing layout of electronic components, most or all of electronic components or some thereof which generate a large amount of heat such as inductors, resistors, transformers, rectifiers or transistors may be disposed in the first portion 201.

As shown in FIG. 11, the electronic components 501 include heat-generating elements 501. At least one of the heat-generating elements 501 is adjacent to the lamp head 23 through which heat is dissipated without occupying resource of heat dissipation of the first heat dissipating channel 7a. The at least one heat-generating element 501 abovementioned is an inductor, a resistor, a rectifier or a control circuit.

As shown in FIG. 11, heat of the at least one heat-generating element is transferred to the lamp head 23 through thermal conduction or radiation and dissipated to air through the lamp head 23.

As shown in FIG. 11, the at least one heat-generating element 501 is in thermal contact with the lamp head 23. In detail, the at least one heat-generating element 501 is located in the lamp head 23. The heat-generating element 501 is in contact with the lamp head 23 through a thermal conductor 53 and the heat-generating element 501 is fastened to the lamp head 23 through the thermal conductor 53. Therefore, the thermal conductor not only performs an effect of heat transfer but also fixes the heat-generating element 501 to avoid loosening of the heat-generating element 501. The phrase "the heat-generating element 501 is located in the lamp head 23" means both the lamp head 23 and the heat-generating element 501 have an overlapping area in a projection perpendicular to the axis of the LED lamp.

As shown in FIG. 11, the thermal conductor 53 is disposed in the lamp head 23 through filling to implement connection between the lamp head 23 and the heat-generating element 501. The thermal conductor 53 only cloaks an end portion of the power source 5 and is higher than the venting 222 in position to prevent overweight resulting from the thermal conductor 53. Additionally, the thermal conductor 53 adopts an insulative material to guarantee safety and prevent the electronic components and metal portion 231 of the lamp head 23 from being in contact. In other embodiments, the thermal conductor 53 may also be a wire connecting the power source 5 to the lamp head 23 (not shown).

As shown in FIG. 11, the lamp head 23 includes the metal portion 231, which is in thermal contact with the thermal conductor 53. That is, at least part of an inner side of the metal portion 231 constitutes a wall of the inner chamber of the lamp shell 2 to make the thermal conductor directly connect with the metal portion 231 and perform heat dissipation by the metal portion 231. Part of the metal portion 231 would perform heat dissipation through air, and another part of the metal portion would perform heat dissipation through a lamp socket connecting to the metal portion 231.

As shown in FIGS. 2 and 19A, in this embodiment, at least one of the electronic components of the power source 5, which is the most adjacent to the first air inlet 2201 of the first heat dissipating channel 7a is a heat intolerance component, such as a capacitor, especially for an electrolytic capacitor. This arrangement can avoid overheating of the heat intolerance component to affect its performance.

As shown in FIG. 19A, in this embodiment, at least part of at least one of the electrolytic capacitors 502 is not located within the power board 51, i.e. at least part of the electrolytic capacitor exceeds the power board 51 in the axial direction of the LED lamp. Under a condition of the same number of the electronic components, length and material cost of the power board 51. In addition, this can make the electrolytic capacitor further adjacent to the first air inlet 2201 to ensure the electrolytic capacitor to be located in a relatively low temperature area.

As shown in FIG. 11, a position of at least one of the heat-generating elements 501 in the axial direction of the LED lamp is higher than a position of the venting hole 222. Most heat of the heat-generating element 501 higher than the venting hole 222 is dissipated through the lamp head 23 or other paths. Thus, most heat therefrom is not dissipated through the venting hole 222, and convection speed of the first heat dissipating channel 7a would not be affected. The heat-generating element is an IC, a transistor, a transformer, an inductor, a rectifier or a resistor.

As shown in FIG. 11, the power board 51 is divided into an upper part and a lower part in the axial direction of the LED lamp. Heat-generating elements are arranged in both the upper part and the lower part. At least one of the heat-generating elements in the upper part is located above the venting hole 222 to lower the temperature of the upper part near the venting hole 222. This can increase an air temperature difference between two venting holes 222 in the upper part and the lower part to enhance convection.

As shown in FIGS. 2, 3 and 19A, when the power board 51 is assembled in the lamp shell 2, it has a first portion in the lamp neck 22 and a second portion in the sleeve 21. The second portion more adjacent to the first air inlet 2201 of the first heat dissipating channel 7a than the first portion. Because of such an arrangement, convention air will reach the second portion first. That is, the second portion is better than the first portion in an effect of heat dissipation. Thus, at least part of heat intolerance elements (e.g. electrolytic capacitors or other elements which is sensitive to high temperature) should be disposed in the second portion. Preferably, all electrolytic capacitors are disposed in the second portion. The power board 51 of the second portion is greater than the first portion in area, so the power board 51 of the second portion has more space for accommodating electronic components to be advantageous to more heat intolerance elements being disposed in the second portion. In this embodiment, heat intolerance elements/thermo-sensitive elements may be separately mounted on two opposite sides of the second portion. In other embodiments, hotter electronic components may be disposed in the second portion (e.g. transformers, inductors, resistors, ICs or transistors) for better heat dissipation.

As shown in FIGS. 1, 2, 3 and 4, the lamp shell 2 includes the lamp head 23, the lamp neck 22 and the sleeve 21. The lamp head 23 connects to the lamp neck 22 which connects to the sleeve 21. The sleeve 21 is located in the heat sink 1 (in the axial direction of the LED lamp, all or most of the sleeve 21, for example, at least 80% of height of the sleeve 21, does not exceed the heat sink 1). The lamp neck 22 projects from the heat sink 1. Both the sleeve 21 and the lamp neck 22 can provide sufficient space to receive the power source 5 and perform heat dissipation, especially for the power source 5 of a high power LED lamp (in comparison with a low power LED lamp, a power source of a high power LED lamp has more complicated composition and larger size). The power source 5 is received in both the lamp neck 22 and lamp head 23. Total height of the lamp neck 22 and the lamp head 23 is greater than height of the heat sink 1 so as to provide more space for receiving the power source 5. The heat sink 1 is separate from both the lamp neck 22 and the lamp head 23 (not overlap in the axial direction, the sleeve 21 is received in the heat sink 1). Thus, the power source 5 in both the lamp neck 22 and the lamp head 23 is affected by the heat sink 1 slightly (heat of the heat sink 1 would not be conducted to the lamp neck 22 and the lamp head 23 along a radial direction). In addition, the configuration of height of the lamp neck 22 is advantageous to the chimney effect of the first heat dissipating channel 7a to guarantee convection efficiency of the first heat dissipating channel 7a. In other embodiments, height of the lamp neck 22 is at least 80% of height of the heat sink 1 to accomplish the above function. The sleeve 21 is made of a thermoisolated material to prevent mutual influence of heat from the fins and the power source.

As shown in FIG. 2, the second air inlet 1301 is located in a lower portion of the heat sink 1 and radially corresponds to an inner side or the inside of the heat sink 1, i.e. the second air inlet 1301 radially corresponds to the inner side or the inside of the fins 11. The inner side or the inside of the fins 11 corresponds to an outer wall (a radially inner side of the fins 11, which nears or abuts against the sleeve 21) of the sleeve 21 of the lamp shell 2. Thus, after convection air flows into the second air inlet 1301, it flows upward along the outer wall of the sleeve 21 to perform convection and radially dissipates heat in the inner side or the inside of the fins 11 and the outer wall of the sleeve 21 to implement an effect of thermal isolation. That is, this can prevent heat of the heat sink 1 is conducted from the outer wall of the sleeve 21 to the inside of the sleeve 21 not to affect the power source 5. From the above, the second heat dissipating channel 7b can not only enhance heat dissipation of the fins 11, but also implement an effect of thermal isolation. Make a positional comparison between the second air inlet 1301 and the LED chips 311, the second air inlet 1301 is located radially inside all of the LED chips 311.

Figure 21:
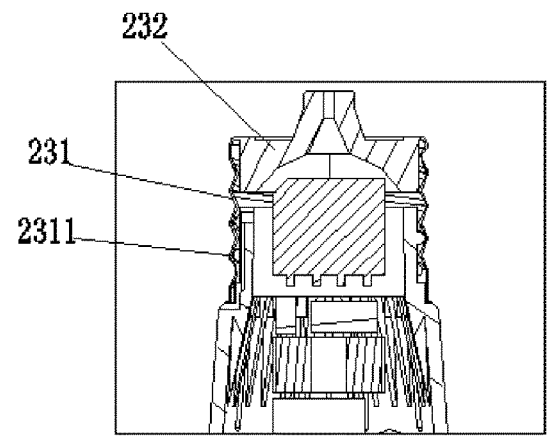
FIG. 21 is a partially schematic view of an LED lamp.

FIG. 20 is an enlarged view of portion B in FIG. 2. As shown in FIG. 20, the lamp head 23 includes a metal portion 231 and an insulative portion 232. Wires of the power source 5 penetrates through the insulative portion 232 to connect with an external power supply. The metal portion 231 connects to the lamp neck 22. In detail, as shown in FIG. 21, an inner surface of the metal portion 231 is provided with a thread through which the lamp neck 22 can be screwed on with the metal portion 231. While the metal portion 231 is dissipating heat generated from the power source 5 in the lamp shell 2 (as described in the above embodiment, at least part of the inner wall of the metal portion 231 forms a wall of the inner chamber of the lamp shell 2, so the thermal conductor directly connects with the metal portion 231 and the metal portion 231 can be used for heat dissipation), an outer surface of the metal portion 231 is formed with a projecting structure 2311 as shown in FIG. 21 to add surface area of the outer surface of the metal portion 231 and enlarge heat dissipating area of the metal portion 231 to increase efficiency of heat dissipation. As for the power source 5, at least part of the power source 5 is located in the lamp head 23, and at least part of heat generated from the power source 5 can be dissipated through the lamp head 23. The inner wall of the metal portion 231 may also be formed with a projecting structure to add surface area of the inner chamber of the lamp shell 2. In this embodiment, the projecting structure can be implemented by forming a thread on the inner surface of the metal portion 231.

Figure 7:
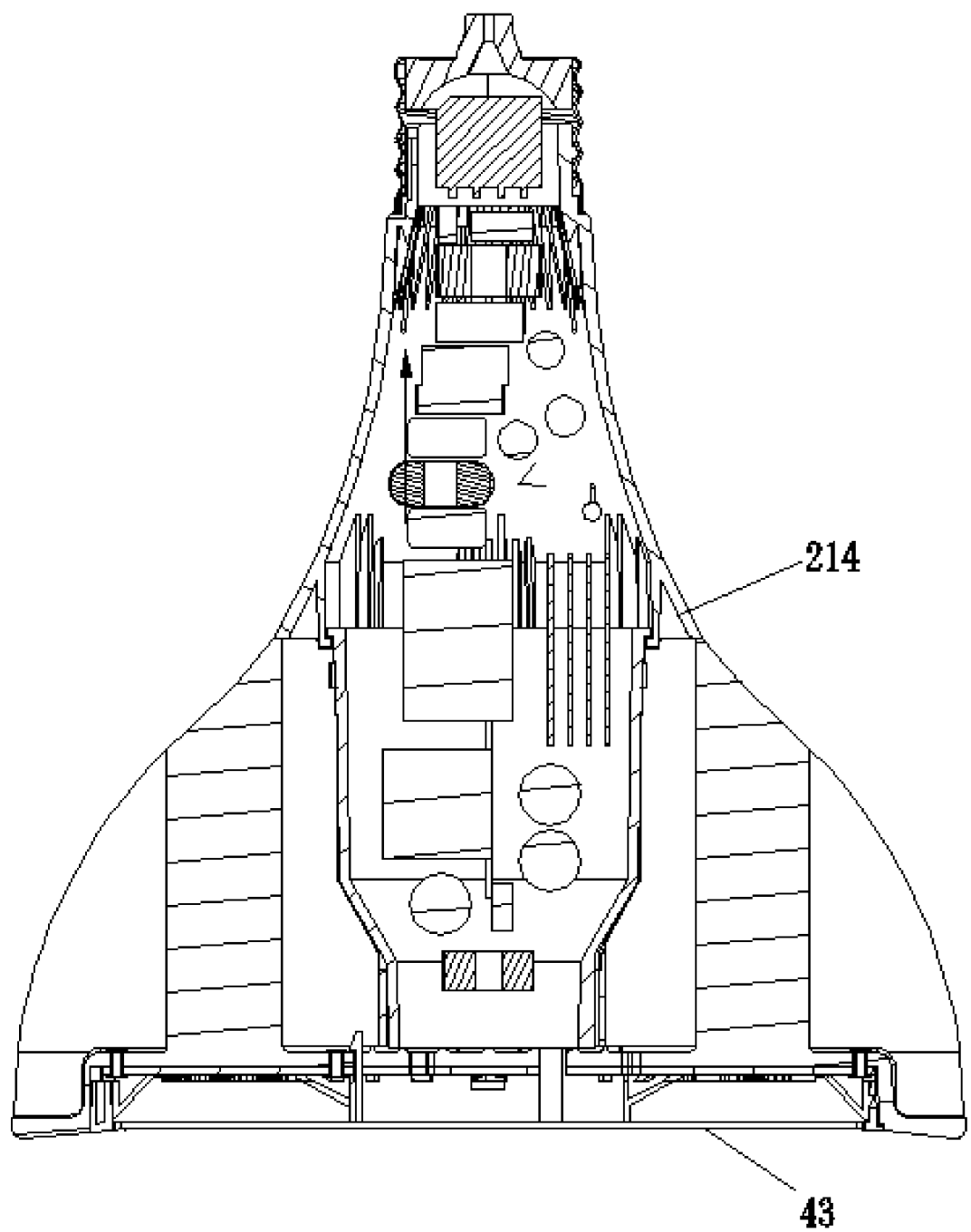
FIG. 7 is a cross-sectional view of another embodiment of the LED lamp according to aspects of the invention, which shows the flat light output surface.
Figure 18:
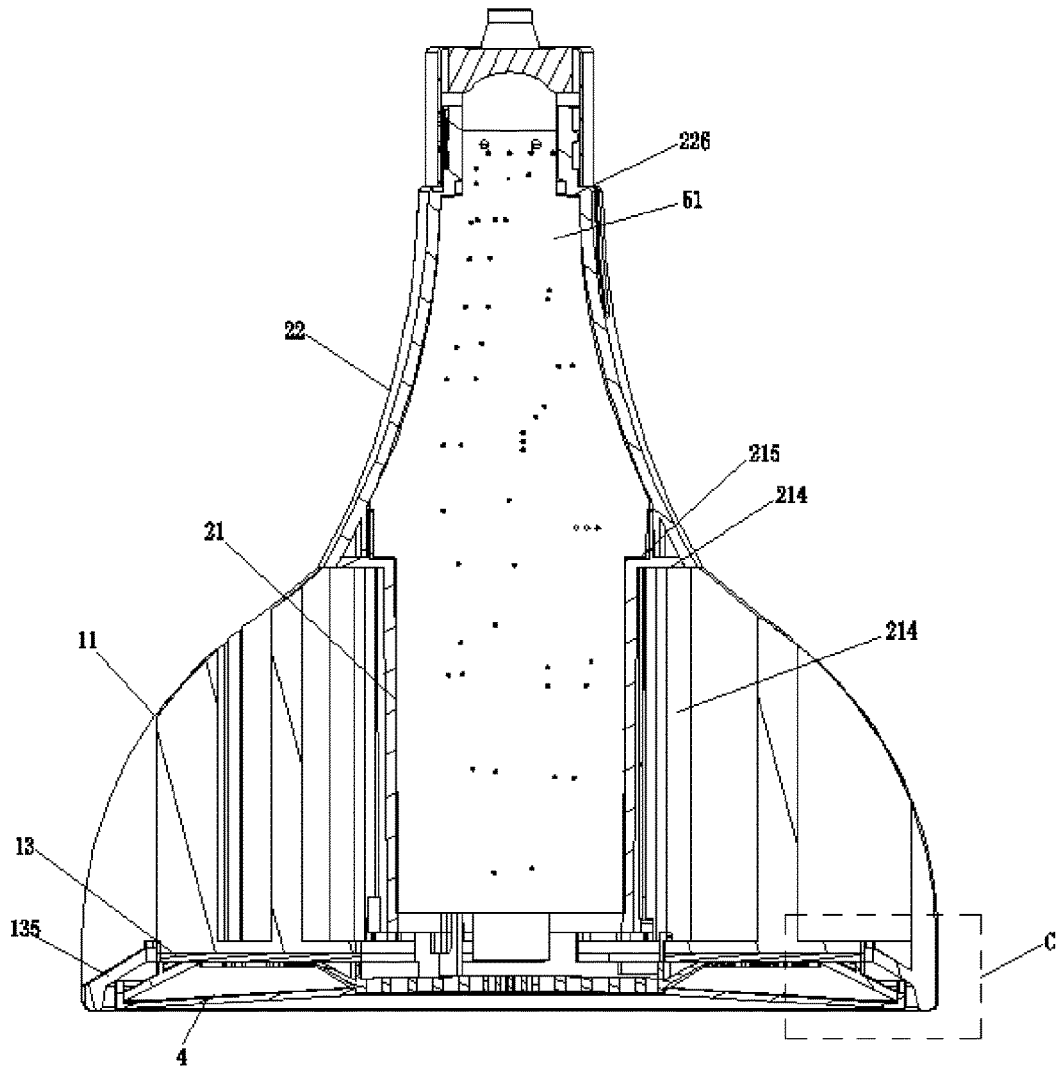
FIG. 18 is a cross-sectional view of an LED lamp, according to another embodiment of the present invention.

As shown in FIGS. 1 and 18, the lamp shell 2 has an airflow limiting surface 214 which extends radially outwardly and is located away from the venting hole 222. The airflow limiting surface 214 cloaks at least part of the fins 11. When the fins are dissipating heat, hot airflow heated by the part of fins 111 cloaked by the airflow limiting surface 214 rises but is blocked by the airflow stopping surface 214 to change its direction (outward along the airflow stopping surface 214). Thus, rising hot airflow is forced to go away from the venting hole 222. This can prevent hot air from both gathering around the venting hole 222 and affecting convection speed of the first heat dissipating channel 7a. Also, this arrangement can prevent rising hot air from both being in contact with the metal portion 231 of the lamp head 23 and affecting heat dissipation of the metal portion 231. Even hot air directly passing the metal portion 231 to conduct into the inner chamber of the lamp shell 2 can also be avoided. The airflow stopping surface 214 may be formed on the sleeve 21. As shown in FIG. 7, in another embodiment of the present invention, the airflow stopping surface 214 may also be formed on the lamp neck 22.

As shown in FIG. 18, in this embodiment, upper portions of at least part of the fins 11 in the axial direction of the LED lamp correspond to the airflow stopping surface 214. When the lamp shell 2 is inserted into the heat sink 1, the airflow stopping surface 214 will have a limiting effect to the lamp shell 2. In this embodiment, the fins abut against the airflow stopping surface 214.

As shown in FIG. 18, in this embodiment, the sleeve 21 is made of a material whose thermal conductivity is less than that of the material of which the lamp neck 22 is made. The airflow stopping surface 214 is formed on the sleeve 21. Height of the heat sink 1 in the axial direction does not exceed the airflow stopping surface 214 to reduce contact area between the heat sink 1 and the lamp neck 22. As for the sleeve 21, the lower its thermal conductivity is, the less the heat conducted from the heat sink 1 to the inside of the sleeve 21 is, and the less the influence to the power source 5 is. As for the lamp neck 22, the less the contact area between the lamp neck 22 and the heat sink 1 is, the lower the thermal conductivity is. The lamp neck 22 has better thermal conductivity than that of the sleeve 21. The lamp neck 22 can dissipate at least part of heat from the power source 5. In other embodiments, both the sleeve 21 and the lamp neck 22 may adopt the same material, a material with relatively low thermal conductivity, such as plastic.

As shown in FIG. 18, in this embodiment, both a wall of the sleeve 21 and a wall of the lamp neck 22 jointly constitute a wall of the inner chamber of the lamp shell 2. Height of the heat sink 1 in the axial direction does not exceed height of the sleeve 21 to make the heat sink 1 corresponds to the sleeve 21 in a radial direction of the LED lamp. That is, the sleeve 21 has an effect of thermal isolation to prevent heat of the heat sink 1 from being conducted to the sleeve 21, so that electronic components of the power source 5 would not be affected. All the lamp neck 22 is higher than a position of the heat sink 1. That is, in a radial direction of the LED lamp, the heat sink 1 does not overlap the lamp neck 22. This can make thermal conduction between the heat sink 1 and the lamp neck 22, and prevent heat from the heat sink 1 to conduct to the inside of the lamp neck 22, so that the electronic components therein would not be affected. As a result, in this embodiment, heat conducting efficiency of the wall of the sleeve 21 is configured to be lower than heat conducting efficiency of the wall of the lamp neck 22. Advantages of such configuration are as follows: (1) because heat conducting efficiency of the sleeve 21 is relatively low, thermal conduction from the heat sink 1 to the sleeve 21 can be reduced to prevent electronic components in the sleeve 21 form being affected by the heat sink 1; and (2) because thermal conducting from the heat sink 1 to the lamp neck 22 does not need to be considered, heat conducting efficiency of the lamp neck 22 can be increased to be advantageous to dissipating heat from the electronic components of the power source 5 through the lamp neck 22. This can avoid life shortening of the power source 5 due to overheating. In this embodiment, in order to make heat conducting efficiency of the wall of the sleeve 21 be lower than heat conducting efficiency of the wall of the lamp neck 22, the sleeve 21 is made of a material with low thermal conductivity and the lamp neck 22 is made of a material with relatively high thermal conductivity. To increase thermal conductivity of the lamp neck 22, the lamp neck 22 may be provided with a venting hole 222 or a heat conducting portion (not shown) such as metal or other materials with high thermal conductivity.

As shown in FIG. 18, the lamp neck 22 has an upper portion and a lower portion. The venting hole 222 is located in the upper portion. Cross-sectional area of the upper portion is less than cross-sectional area of the lower portion. Airflow speed in the upper portion is faster than that in the lower portion, so that initial speed of air ejected from the venting hole 222 can be increased to prevent hot air from gathering around the venting hole 222. In this embodiment, cross-sectional area of the lamp neck 22 upward tapers off in the axial direction to avoid obstruction to air flowing. In this embodiment, cross-sectional area of an inlet of the lower portion of the sleeve 21 is greater than that of the upper portion of the lamp neck 22.

As shown in FIG. 1, the venting hole 222 of the lamp neck 22 is of a strip shape and extends along the axial direction of the LED lamp. Because of gravity of the LED lamp itself, the lamp neck 22 would suffer an axial pulling force. The venting hole 222 are configured to be of a strip shape extending the axial direction of the LED lamp, so stress concentration caused by the venting hole 222 in the lamp neck 22 can be prevented. A maximum diameter of an inscribed circle of the venting hole 222 is less than 2 mm, preferably, between 1 mm and 1.9 mm. As a result, the venting hole 222 can prevent bugs from entering and prevent most dust from passing. On the other hand, the vent 41 can keep better efficiency of air flowing. On the other hand, if the venting hole 222 is configured to annular extending along an circumferential portion of the lamp neck 22, then the lamp neck 22 may be deformed by weight of the heat sink 1 to make the venting hole 222 become larger. This would cause that a maximum diameter of an inscribed circle of the venting hole 222 is greater than 2 mm, this cannot satisfy the requirement.

As shown in FIG. 10, the venting hole 222 is outside an outer surface of the metal portion 231 in radial directions. This can reduce influence to the metal portion 231 because of rising air ejected from the venting hole 222 and prevent heat from being conducted back to the lamp shell 2.

Figure 22:
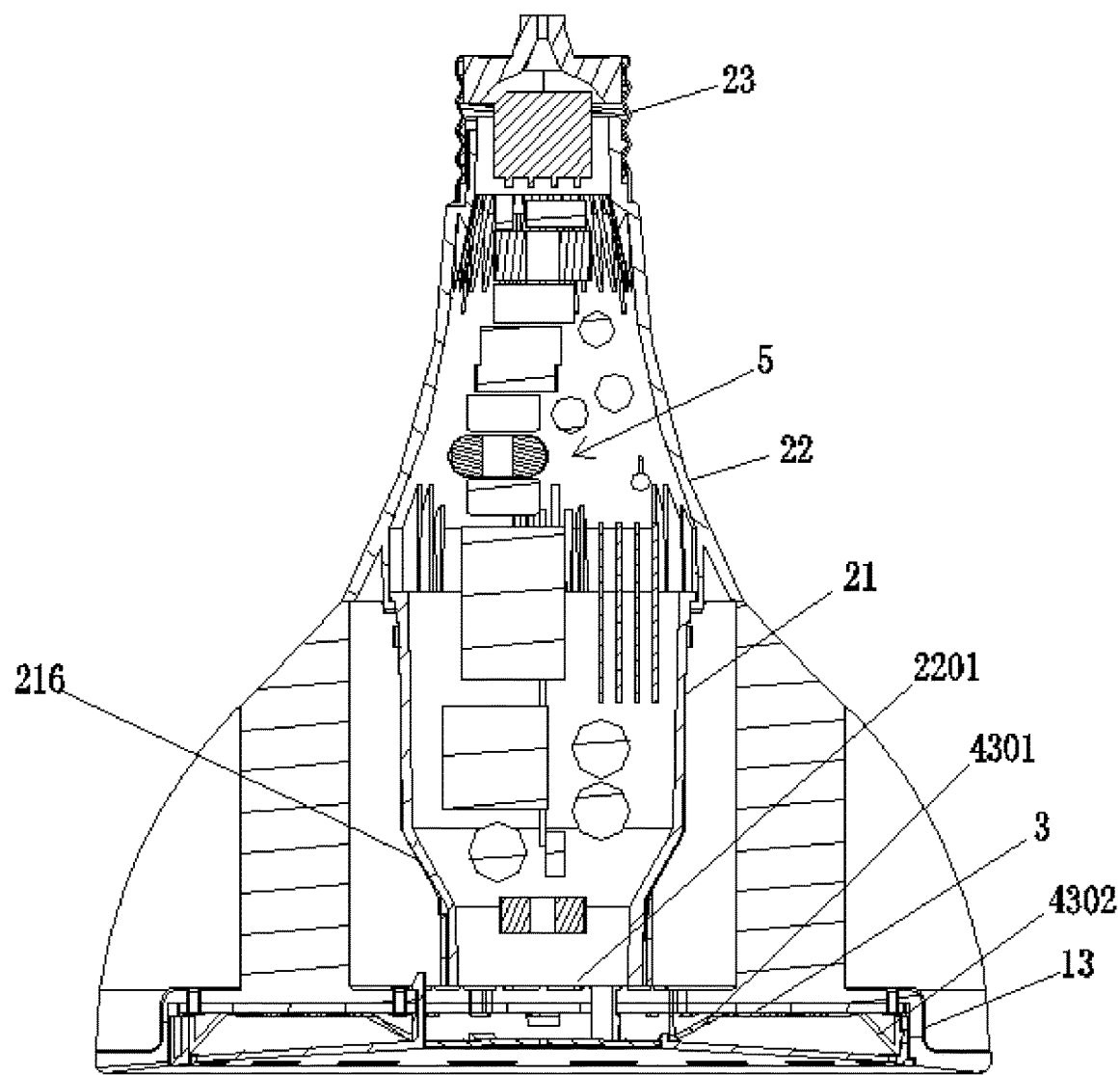
FIG. 22 is a cross-sectional view of the LED lamp of another embodiment.
Figure 23:
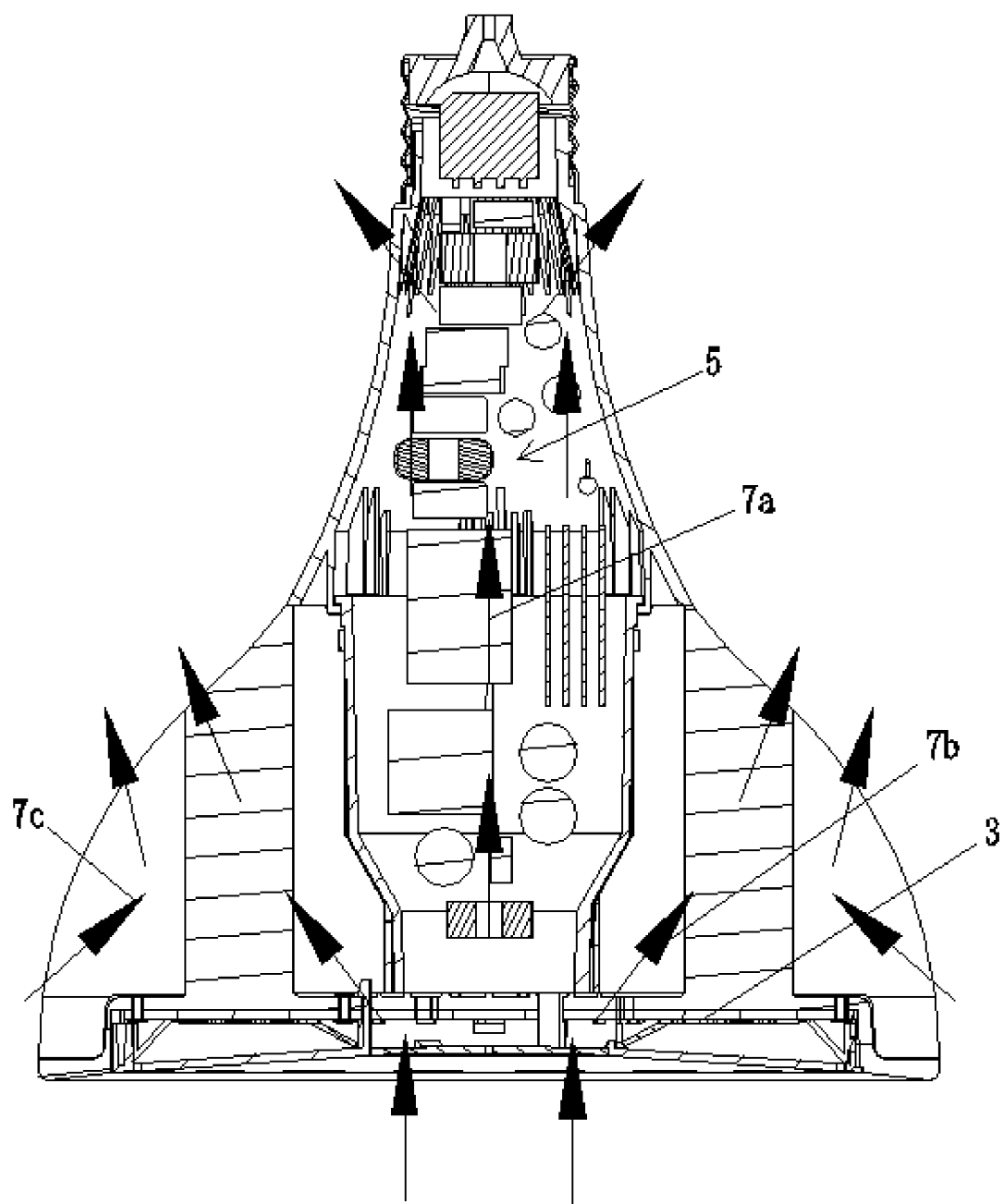
FIG. 23 is a schematic view of an arrangement of the convection channels of the LED lamp of FIG. 22.

FIG. 22 is a cross-sectional view of the LED lamp of another embodiment. FIG. 23 is a schematic view of arrangement of the convection channels in the LED lamp. As shown in FIGS. 22 and 23, in some embodiments, a fundamental structure of the LED lamp is identical to the LED lamp shown in FIG. 1. In some embodiments, the sleeve 21 has an upper portion and a lower portion. The upper portion is connected to the lower portion through an air guiding surface 216. A diameter of cross-section of the air guiding surface 216 downward tapers off along the axis of the LED lamp (along the convection direction of the first heat dissipating channel 7a). That is, the air guiding surface 216 can guide air in the second heat dissipating channel 7b toward the radial outside of the heat sink 1 so as to make air be in contact with more area of the fins 11 to bring out more heat of the fins 11. The sleeve 21 includes a first portion and a second portion in the axial direction. The second portion is a part of the sleeve 21 below the air guiding surface 216 (including the air guiding surface 216). The first portion is the other part of the sleeve 21 above the air guiding surface 216 (but not including the air guiding surface 216). Electronic components of the power source 5, which are located in the second portion of the sleeve 21, include heat intolerance elements such as capacitors, especially electrolytic capacitors so as to make the heat intolerance elements work in low temperature environment (near the first air inlet 2201). In other embodiments, high heat-generating elements may be disposed in the second portion of the sleeve 21, such as resistors, inductors and transformers. As for the second heat dissipating channel 7b, when convection air flows into the second heat dissipating channel 7b and reaches the lower portion of the sleeve 21, the convection air would lean against the outer wall of the sleeve 21 to rise. This can generate an effect of thermal isolation, i.e. heat of the fins 11 is prevented from being conducted to the inside of the sleeve 21 so that the heat intolerance elements therein would not be affected. When the convection air continues to rise, the convection air will flow outward along radial directions of the fins 11 under the guide of the air guiding surface 216 so as to make the convection air be in contact with more area of the fins 11 to enhance an effect of heat dissipation of the fins 11. In this embodiment, the inner chamber of the sleeve 21 is of a wide-upper-side-and-narrow-lower-side channel structure. This significantly enhances the chimney effect and promotes air flowing in the sleeve 21. In addition, the venting hole 222 can be designed on the lamp neck 22 away from the vent to further improve the chimney effect.

As shown in FIGS. 24 to 32, the present disclosure provides a power supply module for LED lamp. The power supply module includes input ends (ACN, ACL) for receiving AC driving signal; a first rectifying circuit 100 for converting the AC driving signal into rectified signal; a filtering 200 for converting the rectified signal into filtered signal; a power converter 400 for converting the filtered signals into power signal which is capable of lighting up an LED light source 500; and a bias generating circuit 600 electrically connected to the input ends (ACN, ACL) and the power converter 400 for performing buck-conversion to the AC driving signal to generate a working voltage of the power converter 400.

Figure 26:
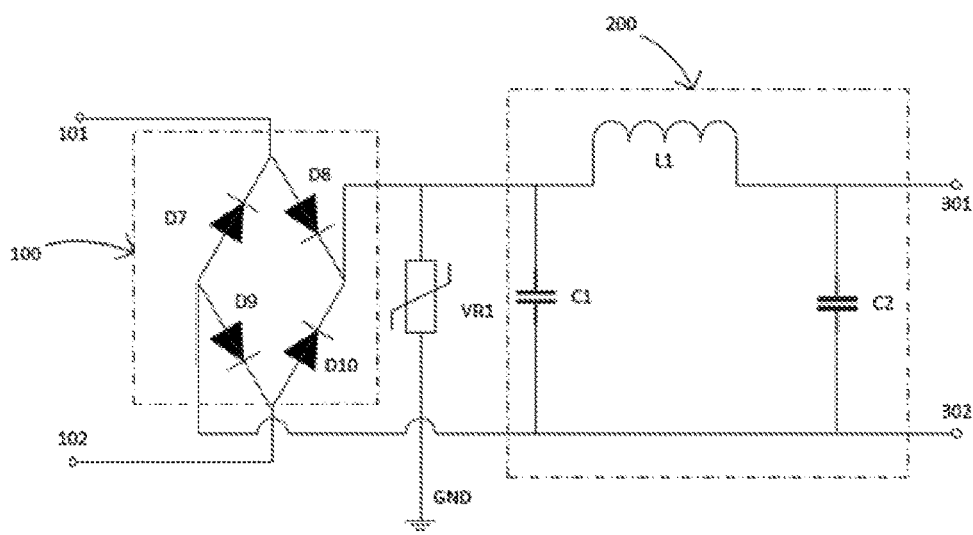
FIG. 26 is a circuit diagram of a rectifier and a filter of an embodiment of the invention.

In this embodiment, the first rectifying circuit 100 may be a bridge rectifier. As shown in FIG. 26, which is a circuit diagram of a rectifying circuit and a filtering circuit of an embodiment of the invention, the first rectifying circuit 100 includes diodes D7, D8, D9 and D10. The first rectifying circuit 100 performs full wave rectification to the AC driving signal to generate DC driving signal (DC power).

In detail, as shown in FIG. 26, anodes of diodes D7, D9 are electrically connected to a first end of the filtering circuit 200, cathodes of diodes D7, D9 are electrically connected to anodes of diodes D8, D10, and cathodes of diodes D8, D10 are electrically connected to a second end of the filtering circuit 200. Contacts of diodes D7 and D8 are electrically connected to the first end ACL. A cathode of diode D8 is electrically connected to a cathode of diode D10. Contacts of diodes D9 and D10 are electrically connected to the second end ACN.

In this embodiment, the filtering circuit 200 includes capacitors C1, C2 and an inductor L1. First ends of both capacitor C1 and inductor L1 serve as the second end of the filtering circuit 200 to electrically connect with cathodes of diodes D8 and D10. The second end of inductor L1 is electrically connected to the first end of capacitor C1. The second ends of capacitors C1 and C2 serve as the first end of the filtering circuit 200 to electrically connect with anodes of diodes D7 and D9. The filtering circuit 200 receives the DC power (the rectified signal) rectified by the first rectifying circuit 100 and filters high frequency components of the DC power.

An electro-magnetic interference (EMI) reduction circuit 900 may be disposed between the input ends (ACN, ACL)

and the rectifying circuit 100. The EMI reduction circuit 900 can reduce influence to the driving signal from an interference magnetic field.

In addition, the branch electrically connected to the input ends ACN, ACL may further be connected with a fuse F1 in series. The fuse F1 may be a current fuse or a temperature fuse.

Figure 24:
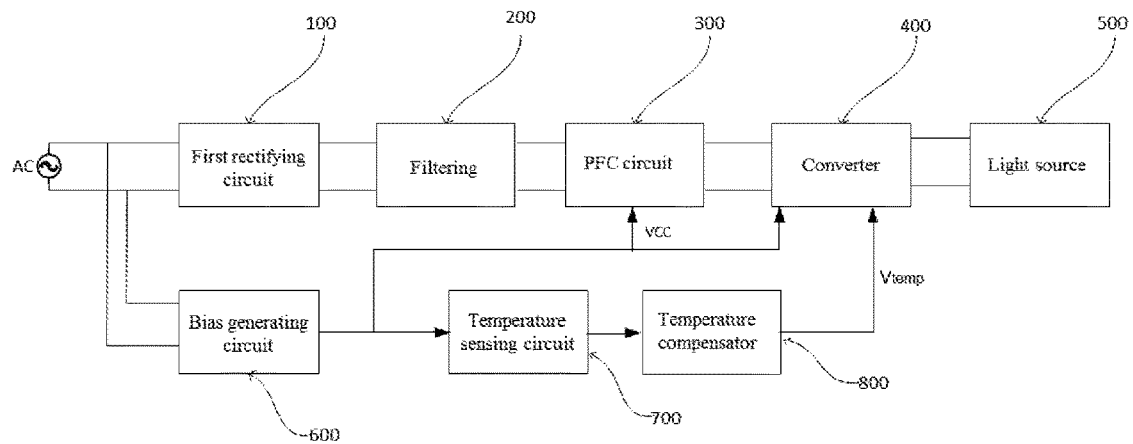
FIG. 24 is a block diagram of the power module of an embodiment of the invention.
Figure 28:
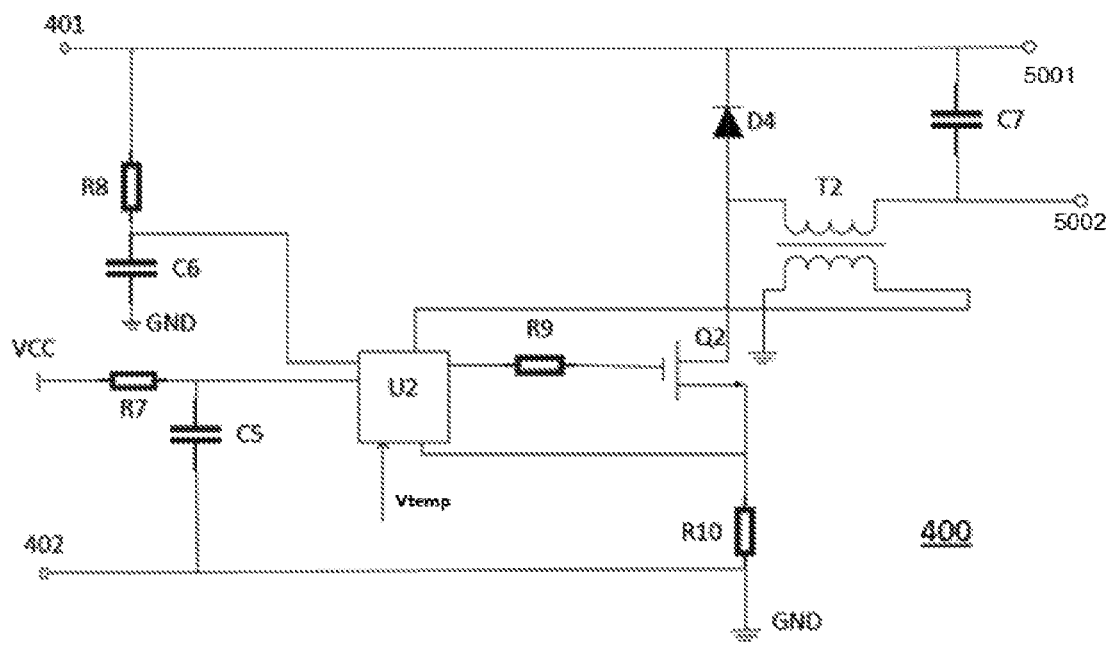
FIG. 28 is a circuit diagram of a power converter of an embodiment of the invention.

FIG. 28 is a circuit diagram of a power converter of an embodiment of the invention. As shown in FIGS. 24 and 28, the power converter 400 receives signal from a pre-stage circuit through the connecting end 401, 402, and the power signal are provided to a post-stage through the connecting ends 5001, 5002. The power converter 400 may adopt a PWM (Pulse Width Modulation) circuit, which controls pulse width to output target signal. In detail, the power converter 400 includes a controller U2, a power switch Q2, a transformer T2 and a diode D10. To reduce both influence resulting from harmonic to circuit properties and conversion loss, a power factor correction (PFC) circuit 300 may be disposed between the power converter 400 and filtering circuit 200. The PFC circuit 300 can increase power factors of the filtered signal by adjusting signal properties (e.g. phase, level or frequency) of the filtered signal. PFC circuit 300 electrically connects to an output end of bias generating circuit 600. In detail, PFC circuit 300 may be an active PFC circuit.

Figure 27:
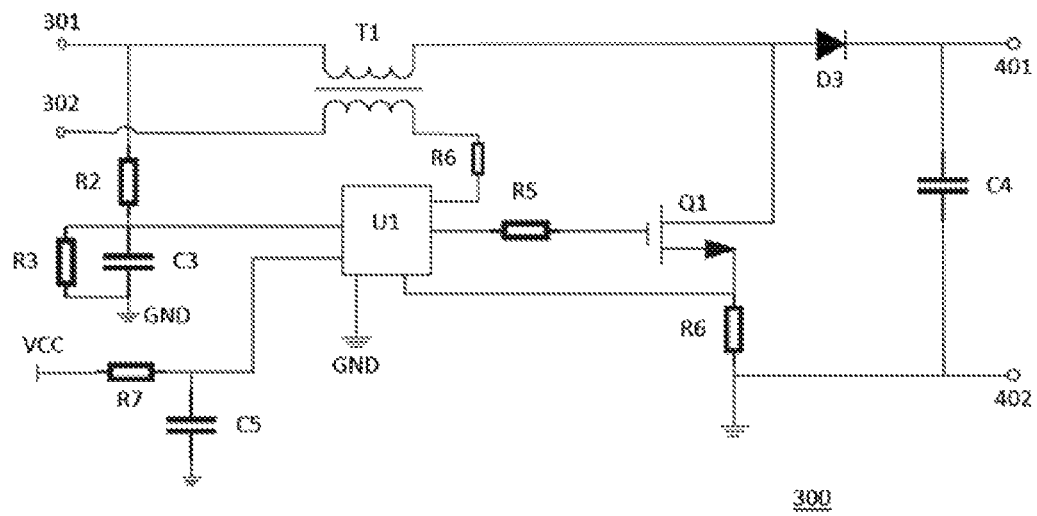
FIG. 27 is a circuit diagram of a PFC of an embodiment of the invention.

FIG. 27 is a circuit diagram of a PFC circuit of an embodiment of the invention. As shown in FIG. 27, PFC circuit 300 receives signal from the filtering circuit 300 through the connecting ends 301, 302 and sends corrected signal to the post-stage power converter 400 through connecting ends 401, 402. PFC circuit 300 includes a controller U1, a power switch Q1 electrically connected to controller U1, a transformer T1 and a diode D3. Power switch Q1 may be a MOSFET. A first end (power end) of the controller U1 electrically connects to an output end 607 of bias generating circuit 600. A second end of controller U1 electrically connects to an end of transformer T1. A coil of transformer T1 electrically connects to a main branch in series. The other end of the coil electrically connected to a second end of controller U1 is grounded. A positive end (also called connecting end 5001) of the DC output ends electrically connects to the main branch. Diode D3 is electrically connected in the branch in series. An anode of diode D3 electrically connects to both an end of transformer T1 and the filtering circuit 200, and a cathode thereof electrically connects to connecting end 401 for electrically connecting to both power converter 400 and connecting end 5001. A third end of controller U1 electrically connects to power switch Q1. An end of power switch Q1 electrically connects to a fifth electrically connecting point between diode D3 and transformer T1. Controller U1 may further electrically connects to a sampling circuit (a connecting point between resistor R2 and capacitor C3 electrically connects to the controller U1, and capacitor C3 electrically connects to resistor R3 in parallel) and other circuits as shown in FIG. 27.

Figure 25:
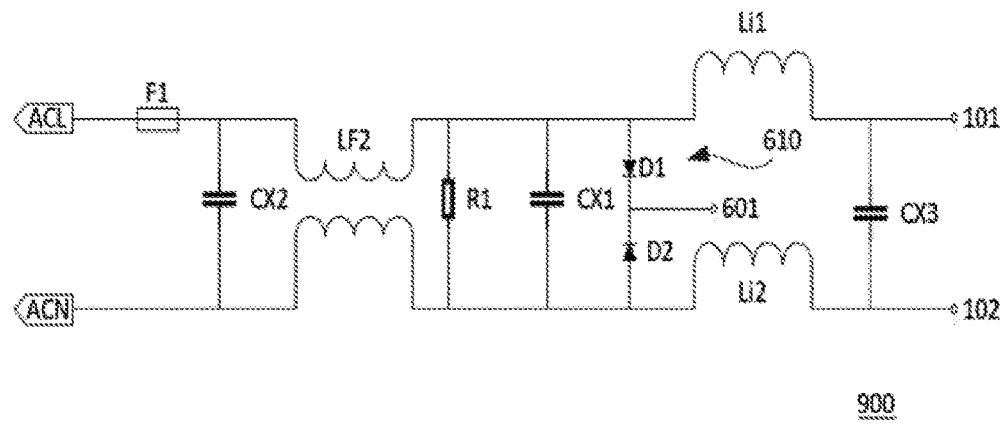
FIG. 25 is a circuit diagram of an EMI reduction circuit of an embodiment of the invention.
Figure 29:
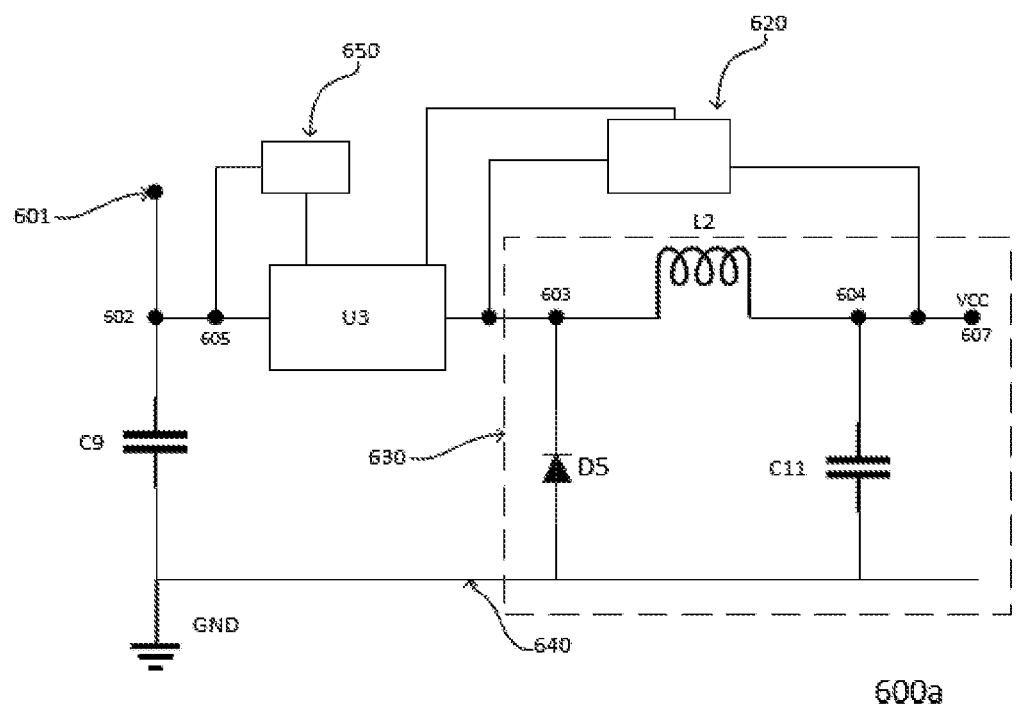
FIG. 29 is a circuit diagram of a bias generator of an embodiment of the invention.

FIG. 29 is a circuit diagram of a bias generating circuit of the first embodiment of the invention. As shown in FIGS. 25 and 29, bias generating circuit 600a may include an electricity obtainer 610, a switch controller U3 and an energy storage flyback unit 630. Electricity obtainer 610 electrically connects to both the input ends (ACN, ACL) and switch controller U3. Switch controller U3 electrically connects to energy storage unit 630 having an output end 607 for outputting a working voltage (VCC). Output end 607 electrically connects to power converter 400 to provide the working voltage (VCC) to the power converter 400.

In an embodiment, the electricity obtainer 610 can convert AC driving signal into DC electricity obtaining signal which are equal to the AC driving signal. As shown in FIGS. 25 and 29, electricity obtainer 610 can be implemented by a second rectifying circuit (hereinafter "second rectifying circuit 610"). Second rectifying circuit 610 includes a first diode D1 and a second diode D2, which are electrically connected in series with opposite polarity (i.e. cathodes of diodes D1 and D2 are electrically connected together). Second rectifying circuit 610 has an electricity obtaining end 601 between diodes D1 and D2. The electricity obtaining end 601 electrically connects to the switch controller U3. By the opposite polarity, the two diodes D1 and D2 rectify the AC driving signal to output DC driving signal at the electricity obtaining end 601.

In detail, the electricity obtaining end 601 further electrically connects to an end of first capacitor C9, and the other end thereof electrically connects to the ground end GND. Switch controller U3 electrically connects to an end of inductor L2, and the other end thereof connects to the output end 607. Inductor L2 can perform both energy storage and release and maintain the current continuity when switch controller U3 is switching.

In this embodiment, energy storage flyback unit 630 may include an inductor L2, a third diode D5 and a second capacitor C11. A cathode of the third diode D5 connects to a connecting end 603 disposed between the switch controller U3 and inductor L2. An anode of third diode D5 connects to ground end GND. An end of second capacitor C11 electrically connects to a second connecting end 604 disposed between inductor L2 and the output end 607. The other end of second capacitor C11 electrically connects to the ground end GND. an end of a load resistor electrically connects to a third connecting end (not shown in FIG. 25) disposed between the second connecting end 604 and the output end 607. The other end of the load resistor electrically connects to ground end GND.

The bias generating circuit 600 may be further provided with a sampling circuit to sample its working status and to be a reference of output signal of the switch controller. In addition, in the practical application, switch controller U3 may be a chip or IC integrated with at least a control circuit and a power switch, but the present invention is not limited thereto.

For example, the sampling circuit may include a first sampling circuit 650 and a second sampling circuit 620. First sampling circuit 650 electrically connects to both the electricity obtaining end 601 (forming a connecting point 605 in FIG. 29) and switch controller U3. The second sampling circuit 620 electrically connects to both the output end 607 and switch controller U3. Switch controller U3 outputs a stable working voltage according to sampling signal from both the first sampling circuit 650 and second sampling circuit 620. Configuration of the sampling circuit is related to the control manner of switch controller U3, the invention is not limited to this. FIG. 29 is a circuit diagram of the bias generating circuit of the first embodiment of the invention.

Figure 30:
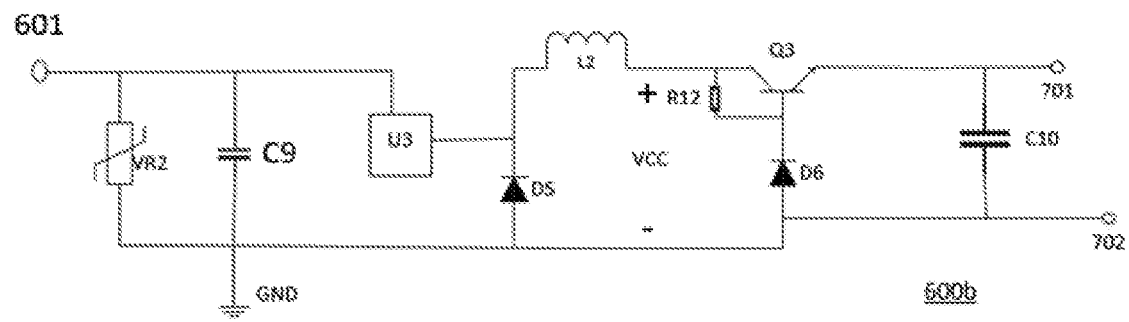
FIG. 30 is a circuit diagram of a bias generator of another embodiment of the invention.
Figures 31, 32:
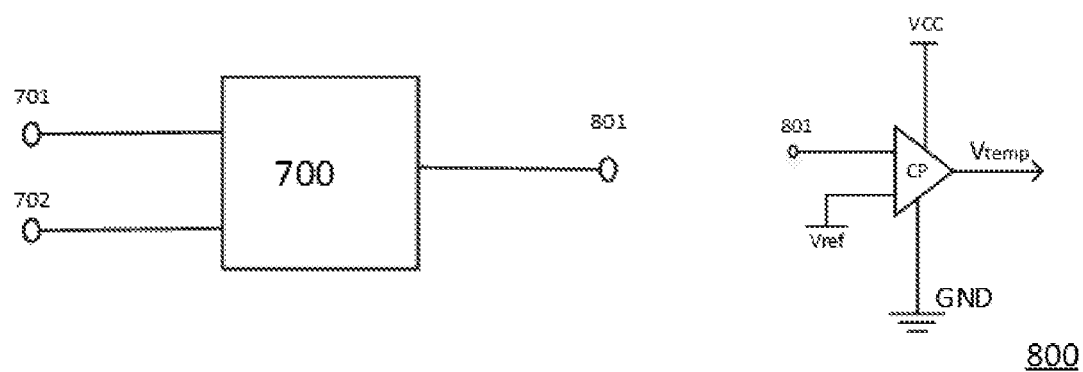
FIG. 31 is a circuit diagram of a temperature detector of an embodiment of the invention.
FIG. 32 is a circuit diagram of a temperature compensator of an embodiment of the invention.

In other embodiments, the bias generating circuit may also be used for providing a working voltage to a temperature sensing circuit 700. FIG. 30 is a circuit diagram of the bias generating circuit of the second embodiment of the invention. FIG. 31 is a circuit diagram of a temperature sensing circuit of an embodiment of the invention. As shown in FIGS. 30 and 31, the temperature sensing circuit 700 electrically connects to power converter 400 for sending temperature detecting signal to power converter 400. The temperature sensing circuit 700 has a temperature sensor electrically connecting to bias generating circuit 600*b* to make bias generating circuit 600*b* provide a working voltage to temperature sensing circuit 600*b*.

In this embodiment, in comparison with the embodiment shown in FIG. 29, the bias generating circuit 600*b* of this embodiment further includes a transistor Q3, a diode D6, a resistor R12 and a capacitor C10. Transistor Q3 may be a BJT as an example (hereinafter refer as BJT Q3). The temperature detector 700 electrically connects to BJT Q3 of the bias generating circuit 600*b*. The collector of BJT Q3 electrically connects to output end 607. The base of BJT Q3 electrically connects to the grounding line with the ground end GND.

Moreover, as shown in FIG. 32, the temperature sensing circuit 700 further electrically connects to a temperature compensator 800. FIG. 32 is circuit diagram of a temperature compensator of an embodiment of the invention. Temperature sensing circuit 700 electrically connects between temperature compensator 800 and bias generating circuit 600*b*. Temperature compensator 800 electrically connects to power converter 400.

The output end of the temperature compensator 800 electrically connects to the controller U2 of the power converter 400 to make the temperature sensing result signal Vtemp fed back to controller U2 of power converter 400, so that controller U2 can adjust the output power depending on the system environment temperature.

In detail, a circuit diagram of the temperature compensator 800 may be as shown in FIG. 32. It should be noted that, the temperature compensator 800 can be implemented by various manners. The invention is not limited to the circuit shown in FIG. 32.

The invention further provides a high power LED lamp including an LED light source 500 and a power supply module as abovementioned connecting with the LED light source 500. In some embodiments, the high power LED lamp means all types of LED lamps whose output power exceeds 30 w, LED lamps which are equivalent to xenon lamps with output power of at least 30 W or LED lamps using high power lamp beads (e.g. lamp beads with rated current above 20 mA).

The above depiction has been described with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

What is claimed is:

1. An LED (light emitting diode) lamp comprising:
a lamp shell including a lamp head, a lamp neck and a sleeve, the lamp head connects to the lamp neck which connects to the sleeve;
a passive heat dissipating element having a heat sink connected to the lamp shell;
a power source having a first portion and a second portion, wherein the first portion of the power source is disposed in the lamp neck, and the second portion of the power source is disposed in inner space of the sleeve; and
a light emitting surface connected to the heat sink of the passive heat dissipating element and comprising LED chips electrically connected to the power source;
wherein the sleeve of the lamp shell is made of a material having lower thermal conductivity than that of material of the heat sink;
wherein the sleeve of the lamp shell is encircle covered by the heat sink, such that the second portion of the power source and the heat sink of the passive heat dissipating element are thermally insulated by the sleeve to prevent thermal effecting from the heat sink to the power source in the sleeve.

2. The LED lamp of claim 1, wherein height of the lamp neck is at least 80% of height of the heat sink.

3. The LED lamp of claim 1, wherein the heat sink comprises fins and a base, the light emitting surface is formed with an air inlet, the air inlet is located in a lower portion of the heat sink and radially corresponds to an inner side or the inside of the heat sink, the inner side or the inside of the fins corresponds to an outer wall of the sleeve of the lamp shell.

4. The LED lamp of claim 1, wherein the sleeve and the lamp neck are made of plastic.

5. The LED lamp of claim 3, wherein a distance is kept between distal ends of the fins and the sleeve, and air exists in the distance between the fins and the sleeve of the lamp shell.

6. The LED lamp of claim 3, wherein part of the fins are in contact with an outer surface of the sleeve.

7. The LED lamp of claim 1, wherein a first heat dissipating channel formed in a chamber of the lamp shell for dissipating heat generated from the power source while the LED lamp is working, and the chamber is located between bottom of the LED lamp and an upper portion of the lamp neck, the first heat dissipating channel comprises a first end on the light emitting surface to allow air flowing from outside of the LED lamp into the chamber, and a second end on the upper portion of the lamp neck of the lamp shell to allow air flowing from inside of the chamber out to the LED lamp.

8. The LED lamp of claim 7, wherein a second heat dissipating channel formed in the heat sink and between the fins and the base for dissipating the heat generated from the LED chips and transferred to the heat sink, the second heat dissipating channel comprises a third end on the light emitting surface to allow air flowing from outside of the LED lamp into the second heat dissipating channel, and flowing out from spaces between every adjacent two of the fins.

9. The LED lamp of claim 8, wherein the light emitting surface further comprises an aperture configured to simultaneously communicate with both the first end of the first heat dissipating channel and the third end of the second heat dissipating channel.

10. The LED lamp of claim 9, wherein the aperture is located in a central region of the light emitting, and the aperture forms an air intake of both the first heat dissipating channel and the second heat dissipating channel.

11. The LED lamp of claim 7, wherein the second end on the lamp shell is formed with a venting hole, the lamp shell has an airflow limiting surface which extends radially outwardly and is located away from the venting hole, the airflow limiting surface cloaks at least part of the fins.

12. The LED lamp of claim 11, wherein upper portions of at least part of the fins in the axial direction of the LED lamp correspond to the airflow limiting surface.

13. The LED lamp of claim 8, further comprising a lamp cover, the lamp cover connected with the heat sink and having a light output surface and an end surface, wherein the end surface is formed with a vent to let air flowing from outside of the LED lamp into both the first heat dissipating channel and the second heat dissipating channel through the vent.

14. The LED lamp of claim 13, wherein the first end is projected onto the end surface in an axis of the LED lamp to occupy an area on the end surface, which is defined as a first portion, another area on the end surface is defined as a second portion, and the vent in the first portion is greater than the vent in the second portion in area.

15. The LED lamp of claim 1, wherein all the electrolytic capacitors are disposed in the sleeve.

16. The LED lamp of claim 15, wherein at least one of the electronic components of the power source, which is the most adjacent to the first end of the first heat dissipating channel is one of the electrolytic capacitor.

17. The LED lamp of claim 16, wherein at least part of the electrolytic capacitor which is the most adjacent to the first end of the first heat dissipating channel exceeds the power board in the axial direction of the LED lamp.

18. The LED lamp of claim 1, wherein total height of the lamp neck and the lamp head is greater than height of the heat sink.

19. The LED lamp of claim 13, further comprising an inner reflecting surface disposed inside the light output surface of the lamp cover and an outer reflecting surface disposed in the outer circle of the array of the LED chips, wherein the inner reflecting surface is configured to reflect part of light emitted from the inmost of the array of LED chips, the outer reflecting surface is configured to reflect part of light emitted from the outermost of the array of LED chips.

20. The LED lamp of claim 19, wherein the heat sink comprises first fins and second fins, bottoms of both the first fins and the second fins in an axis of the LED lamp connect to the base, the first fins interlace with the second fins at regular intervals, and one of the second fins includes a third portion and two fourth portions, the two fourth portions are symmetrical about the third portion.

* * * * *